(12) United States Patent
Mayer et al.

(10) Patent No.: US 10,374,394 B2
(45) Date of Patent: Aug. 6, 2019

(54) NANOWIRE LASER STRUCTURE AND FABRICATION METHOD

(71) Applicant: Technische Universitaet Muenchen, Munich (DE)

(72) Inventors: Benedikt Mayer, Munich (DE); Gregor Koblmueller, Regensburg (DE); Jonathan Finley, Aschheim (DE); Johannes Klicpera, Munich (DE); Gerhard Abstreiter, Hallbergmoos (DE)

(73) Assignee: Technische Universitaet Muenchen, Munich (DE)

( * ) Notice: Subject to any disclaimer, the term of this patent is extended or adjusted under 35 U.S.C. 154(b) by 0 days.

(21) Appl. No.: 15/759,977

(22) PCT Filed: Sep. 14, 2016

(86) PCT No.: PCT/EP2016/071656
§ 371 (c)(1),
(2) Date: Mar. 14, 2018

(87) PCT Pub. No.: WO2017/046138
PCT Pub. Date: Mar. 23, 2017

(65) Prior Publication Data
US 2018/0254611 A1 Sep. 6, 2018

(30) Foreign Application Priority Data

Sep. 15, 2015 (EP) ..................................... 15185311

(51) Int. Cl.
*H01S 5/34* (2006.01)
*H01S 5/00* (2006.01)
(Continued)

(52) U.S. Cl.
CPC ............ *H01S 5/3428* (2013.01); *G02F 1/225* (2013.01); *H01S 5/0085* (2013.01);
(Continued)

(58) Field of Classification Search
CPC .... H01S 5/3428; H01S 5/0085; H01S 5/0092; H01S 5/021; H01S 5/0243; H01S 5/026;
(Continued)

(56) References Cited

U.S. PATENT DOCUMENTS 7,492,795 B1   2/2009  Delfyett et al.
2003/0026514 A1*  2/2003  Deliwala ............... B82Y 20/00
                                               385/2
(Continued)

FOREIGN PATENT DOCUMENTS

EP          2 509 119 A1    10/2012

OTHER PUBLICATIONS

International Search Report and Written Opinion dated Jan. 25, 2017 in related application PCT/EP2016/071656 filed Sep. 14, 2016 (20 pgs).
(Continued)

*Primary Examiner* — Jerry M Blevins
(74) *Attorney, Agent, or Firm* — Steven J. Grossman; Grossman Tucker Perreault & Pfleger PLLC

(57) ABSTRACT

A core-shell nanowire laser structure comprises a substrate (12), an elongated support element (14) extending from the substrate, the support element having a first diameter, and an elongated body element (16) extending on and/or around the support element, the body element having a second diameter at least two times larger than the first diameter, wherein the body element is spaced apart from the substrate.

13 Claims, 8 Drawing Sheets

(51) Int. Cl.
| | |
|---|---|
| H01S 5/02 | (2006.01) |
| H01S 5/024 | (2006.01) |
| H01S 5/026 | (2006.01) |
| H01S 5/183 | (2006.01) |
| G02F 1/225 | (2006.01) |
| H01S 5/30 | (2006.01) |
| H01S 5/42 | (2006.01) |
| G02B 6/42 | (2006.01) |
| H01S 3/107 | (2006.01) |
| H01S 3/108 | (2006.01) |
| H01S 3/11 | (2006.01) |
| H01S 3/14 | (2006.01) |
| H01S 5/06 | (2006.01) |
| H01S 5/14 | (2006.01) |

(52) U.S. Cl.
CPC .......... *H01S 5/0092* (2013.01); *H01S 5/021* (2013.01); *H01S 5/026* (2013.01); *H01S 5/0243* (2013.01); *H01S 5/18369* (2013.01); *H01S 5/3054* (2013.01); *H01S 5/341* (2013.01); *H01S 5/423* (2013.01); *G02B 6/42* (2013.01); *H01S 3/107* (2013.01); *H01S 3/108* (2013.01); *H01S 3/1103* (2013.01); *H01S 3/14* (2013.01); *H01S 5/0218* (2013.01); *H01S 5/0265* (2013.01); *H01S 5/0608* (2013.01); *H01S 5/142* (2013.01); *H01S 5/305* (2013.01); *H01S 5/42* (2013.01)

(58) Field of Classification Search
CPC .... H01S 5/18369; H01S 5/3054; H01S 5/341; H01S 5/423; G02F 1/225; G02B 6/42
USPC .......................................................... 385/3
See application file for complete search history.

(56) References Cited

U.S. PATENT DOCUMENTS

| | | | | |
|---|---|---|---|---|
| 2004/0005723 | A1* | 1/2004 | Empedocles | B81C 99/008 438/1 |
| 2006/0280414 | A1* | 12/2006 | Beausoleil | B82Y 20/00 385/125 |
| 2008/0036038 | A1 | 2/2008 | Hersee et al. | |
| 2011/0163292 | A1* | 7/2011 | Wang | B82Y 20/00 257/13 |
| 2012/0235117 | A1* | 9/2012 | Fukui | H01L 21/02488 257/13 |
| 2014/0301420 | A1 | 10/2014 | Kawaguchi et al. | |

OTHER PUBLICATIONS

Chen, Roger, et al; "Nanolasers Grown on Silicon", Nature Photonics, Mar. 2011; vol. 5, pp. 170-175.

Green, William M.J., et al; "Hybrid InGaAsP—InP Mach-Zehnder Racetrack Resonator for Thermooptic Switching and Coupling Control"; Optics Express, Mar. 7, 2005, vol. 13, No. 5, pp. 1651-1659.

Lin, Zhen, et al; "Design of III-V Nanowires Based Micosources Vertically Coupled to a Si Waveguide for Optical Interconnects", 26th International Conference on Indium Phosphide and Related Materials, Montpellier, France, May 11-15, 2014; (2 pgs.).

Martensson, Thomas, et al; "Epitaxial III-V Nanowires on Silicon", American Chemical Society; NANO Letters, Sep. 23, 2004, vol. 4, No. 10, pp. 1987-1990.

Mayer, Benedikt, et al; "Lasing from Individual GaAs—AlGaAs Core-shell Nanowires up to Room Temperature", Nature Communications, Dec. 5, 2013, vol. 4: Article No. 2931 (28 pgs.).

Noborisaka, J., et al; "Fabrication and Characterization of Freestanding GaAs/AlGaAs Core-shell Nanowires and AlGaAs Nanotubes by Using Selective-area Metalorganic Vapor Phase Epitaxy"; Applied Physics Letters, American Institute of Physics, Aug. 24, 2005, (3 pgs), vol. 87, No. 9, Melville, New York.

Sieler, Marcel, et al; "Design and Realization of an Ultra-Slim Array Projector", The Japan Society of Applied Physics; 17th Microoptics Conference (MOC, 11), Sendai, Japan, Oct. 30-Nov. 2, 2011 (4 pgs).

Sieler, Marcel, et al; "Ultraslim Fixed Pattern Projectors with Inherent Homogenization of Illumination"; Applied Optics, vol. 51, Issue 1, Jan. 1, 2012, pp. 64-74.

Sun, Hao, et al., "Nanopillar Lasers Directly Grown on Silicon with Heterostructure Surface Passivation", ACS NANO, Jun. 3, 2014, vol. 8, No. 7, pp. 6833-6839.

Treu, Julian, et al; Enhanced Luminescence Properties of InAs—InAsP Core-Shell Nanowires, American Chemical Society, NANO Letters, Nov. 25, 2013, vol. 13, pp. 6070-6077.

Wang, Zhechao, et al; "Polytypic InP Nanlaser Monolithically Integrated on (001) Silicon", American Chemical Society, NANO Letters, Sep. 27, 2013, pp. 5063-5069.

* cited by examiner

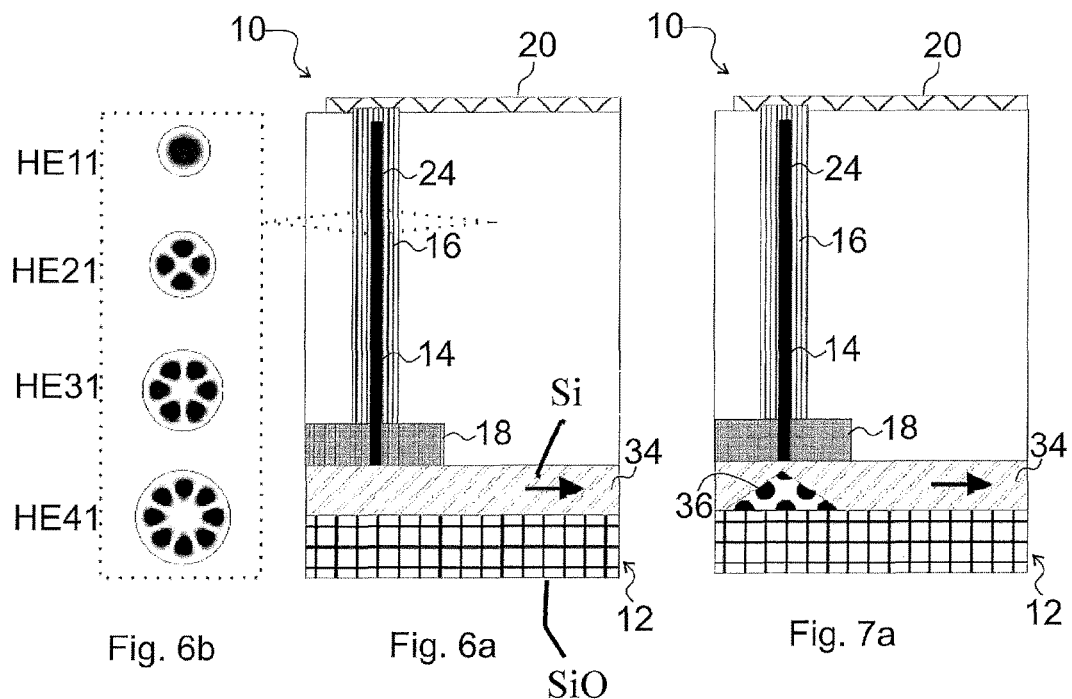
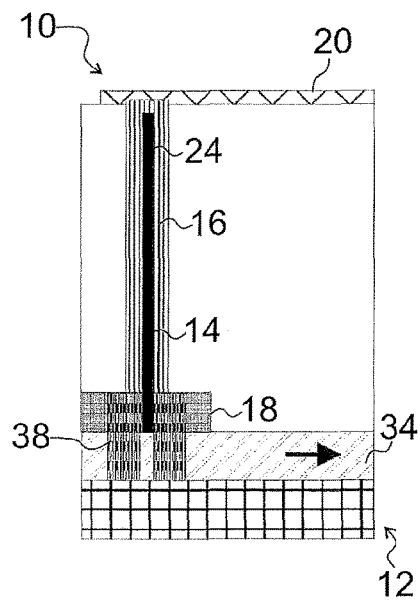
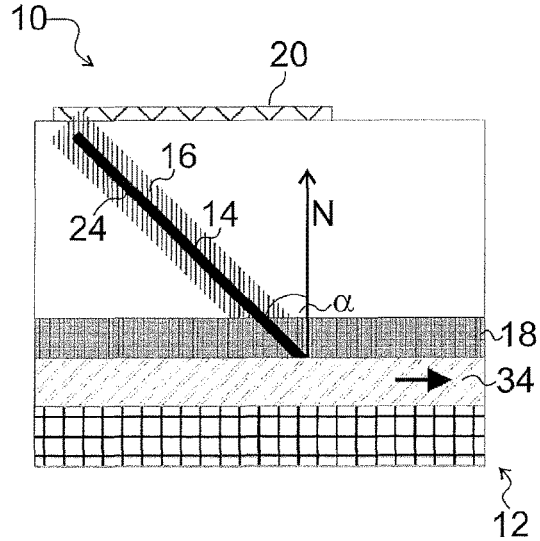
Fig. 6b  Fig. 6a  Fig. 7a
Fig. 7b  Fig. 7c

NANOWIRE LASER STRUCTURE AND FABRICATION METHOD

FIELD OF THE INVENTION

The present disclosure relates to a nanowire laser structure and to a method for forming a nanowire laser structure, in particular for forming a monolithically integrated nanowire laser.

BACKGROUND

Site selective growth of nanowire lasers, in particular on silicon, has a large potential and may become an important building block of future photonic devices. In particular, semiconductor III-V nanowires have the potential to create a new generation of lasers and on-chip coherent light sources by virtue of their ability to operate as single mode optical waveguides, resonantly recirculate optical fields and provide gain. Furthermore, the small nanowire footprint facilitates direct growth on silicon, as has been demonstrated by T. Martensson et al., "Epitaxial III-V Nanowires on Silicon", Nano. Lett. 4 (2004) 1987, and J. Treu et al., "Enhanced Luminescence Properties of InAs—InAsP Core-Shell Nanowires", Nano. Lett. 13 (2013) 6070. However, the low refractive index contrast between the nanowire and the silicon substrate provides poor modal reflectivity and hampers the lasing operation. For instance, for GaAs—AlGaAs nanowires grown on silicon, the modal reflectivity at the GaAs-silicon interface is typically below 1%, and only by removing the nanowires from the growth substrate reflectivities can become large enough to achieve lasing, as demonstrated by B. Mayer et al., "Lasing from Individual GaAs—AlGaAs Core-Shell Nanowires up to Room Temperature", Nature Photonics 4, 2013. However, removing the nanowires from the growth substrate and transferring them to a different substrate is a complex and error-prone nanofabrication process, and has hindered the progress towards the mass-production of integrated nanowire-based photonic devices.

Recently, tapered InGaAs nanopillars supporting higher order helical optical modes have been shown to lase on silicon, cf. R. Chen et al., "Nanolasers Grown on Silicon", Nature Photonics 5 (2011) 170, and H. Sun et al., "Nanopillar Lasers Directly Grown on Silicon with Heterostructure Surface Passivation", ACS Nano. 8, 2014. However, their comparatively large footprint and multimode resonator structure typically lead to fairly low spontaneous emission coupling factors in the order of $\beta=0.01$, and, consequently, high pump thresholds for lasing and a complex far-field radiation pattern.

What is needed is an integrated nanowire laser structure that has a high coupling factor and is easy and efficient to manufacture.

OVERVIEW OF THE INVENTION

This objective is achieved by means of a nanowire laser structure according to independent claim 1 and a method for forming a nanowire laser structure according to independent claim 12. The dependent claims relate to preferred embodiments.

A nanowire laser structure according to the present invention comprises a substrate, an elongated support element extending from said substrate, said support element having a first diameter, and an elongated body element extending on and/or around said support element, said body element having a second diameter at least two times larger than said first diameter, wherein said body element is spaced apart from said substrate.

The inventors found that by forming an elongated body element on and/or around a relatively thinner support element, wherein a diameter of the elongated body element is at least twice the diameter of the elongated support element, and spacing the body element apart from the substrate, a laser cavity with a high spontaneous emission factor can be achieved in a structure grown site-selectively directly on the substrate.

Due to their elongated structure, the support element and the body element together can be considered a nanowire.

An elongated support element, in the sense of the present disclosure, may be understood to denote a support element whose length is larger than its width.

Similarly, an elongated body element may be understood, in the sense of the present disclosure, to denote a body element whose length is larger than its width.

The invention obviates the need to remove the nanowire from the substrate after growth, and transfer it to a different base or substrate to achieve lasing. Rather, the nanowire laser structure can be grown directly on the substrate, thereby greatly enhancing the manufacturing efficiency, reducing the manufacturing cost, and making the nanowire laser structure amenable to mass-scale semiconductor fabrication techniques.

The nanowire laser structure according to the present invention can be employed in a large number of semiconductor heterostructures and may be employed in the fabrication of quantum wells, quantum wires, and quantum dots. Advantageously, the nanowire laser structure according to the present invention allows to adjust a wavelength of the system by suitable choosing the dimensions of the nanowire laser, as will be described in more detail below. The invention also allows to achieve a high temperature stability, and thereby to increase the efficiency.

The nanowire laser structure according to the invention may also be used as a single photon source, and achieves a high yield and good coupling to optical fibers.

In a preferred embodiment, said second diameter is at least three times larger than said first diameter.

Said support element may form a pillar structure on which said body element is attached.

A body element that is spaced apart from said substrate may denote a body element and a substrate that are not in direct physical contact.

In an embodiment, the nanowire laser structure comprises a first reflective layer between said body element and said substrate.

In an example, said first reflective layer is in physical contact with said substrate and/or with said body element. However, the invention is not so limited, and the nanowire laser structure may comprise further layers in between said first reflective layer and said substrate, and/or in between said first reflective layer and said body element.

Said first reflective layer may surround said support element. In other words, said support element may extend from said substrate through said reflective layer to said body element.

In an embodiment, said first reflective layer may have a reflectivity of at least 0.2, preferably at least 0.3, and in particular at least 0.5.

The inventors recorded the output characteristics along a detection axis parallel to the nanowire axis and found spontaneous emission factors of $\beta=0.2$ or even higher, several orders of magnitude larger than for conventional diode lasers and other novel Si based laser concepts, and an upper limit for the low-threshold pump energy of 11±1 pJ per pulse.

It is a particular advantage that the nanowire laser structure according to the present invention is versatile, and can be fabricated in different dimensions for a large range of different laser applications, ranging from the infrared via the visible spectrum to the ultraviolet spectral range. The dimensions and characteristics of the nanowire laser structure according to the present invention are best characterized by intrinsic dimensions in terms of the wavelength of the laser signal that the nanowire laser structure is adapted to emit.

As an example, said nanowire laser structure may be adapted to emit a laser signal at a wavelength $\lambda$, wherein a thickness of said first reflective layer may be an integer multiple of $\lambda/(2n)$, wherein n denotes an index of refraction of said first reflective layer.

By choosing a thickness of said first reflective layer an integer multiple of $\lambda/(2n)$, reflection may be achieved both at an upper and a lower surface facet of said first reflective layer, thereby further enhancing the reflectivity such that good lasing can be achieved.

In an example, a thickness of said first reflective layer may be no smaller than 30 nm, and preferably no smaller than 50 nm, in particular no smaller than 100 nm.

Moreover, a thickness of said first reflective layer may be no larger than 800 nm, and preferably no larger than 400 nm.

In an example, said first reflective layer comprises a distributed Bragg reflector and/or a high contrast grating.

Said first reflective layer may comprise a dielectric material, in particular $SiO_2$ and/or SiN.

However, the invention is not so limited, and alternatively and/additionally a gap may be formed between said body element and said substrate.

For instance, said gap may be a vacuum gap, and/or may be filled by an ambient medium, such as air.

In an embodiment, said substrate may comprise a semiconductor material, in particular silicon (Si).

As an example, said support element may extend from a Si (100) surface or from a Si (111) surface of said substrate.

In an example, said support element extends through said body element, and said body element at least partly surrounds said support element. In this sense, said support element may be considered a core for said nanowire laser structure, and said body element may be considered a shell of said nanowire laser structure, said shell extending around said core.

Said support element and/or said body element may comprise a III-V semiconductor, in particular GaAs and/or InGaAs and/or InP and/or GaP.

Said support element and/or said body element may also comprise a II-VI semiconductor and/or a group-III nitride, in particular GaN and/or InGaN and/or AlGaN.

The choice of the material usually depends on the desired laser properties and applications. In principle all material combinations, well known from solid state laser gain media, can be applied to the nanowire support/body structures, as well.

The nanowire laser structure may comprise a pn junction and/or a pin junction.

Hence, the invention allows to directly integrate the laser diode into the nanowire structure.

In an example, a lower part of said support element and/or said body element may comprise a first semiconductor region with a first doping concentration, said lower part facing said substrate, and an upper part of said support element and/or said body element may comprise a second semiconductor region with a second doping concentration different from said first doping concentration, said upper part facing away from said substrate.

In this configuration, a horizontal or lateral p-n junction may be formed.

As an example, said first doping concentration may be a p concentration, and said second doping concentration may be an n concentration, or vice versa. Said n concentration is preferably at least 5 times smaller than said p concentration. In an example, said n concentration is at most 20 times smaller than said p concentration.

In an example, the ratio between the p concentration and the n concentration amounts to at least 0.6 times the ratio between the effective mass of the holes and the effective mass of the electrons.

In an embodiment, the ratio between the p concentration and the n concentration amounts to at most 1.4 times the ratio between the effective mass of the holes and the effective mass of the electrons.

However, the invention is not limited to lateral pn junctions, but may also comprise a radial pn junction. A radial pn junction may provide a particularly large contact surface between the positively doped and negatively doped regions, thereby further enhancing the lasing efficiency.

In particular, said support element may extend through said body element, and said body element may at least partly surround said support element, wherein said support element comprises a first semiconductor region with a first doping concentration and said body element comprises a second semiconductor region with a second doping concentration different from said first doping concentration.

In an example, said first doping concentration is a p concentration, and said second doping concentration is an n concentration, or vice versa.

In an example, said n concentration is at least 5 times smaller than said p concentration. In an example, said n concentration is at most 20 times smaller than said p concentration.

In an example, the ratio between the p concentration and the n concentration amounts to at least 0.6 times the ratio between the effective mass of the holes and the effective mass of the electrons.

In an embodiment, the ratio between the p concentration and the n concentration amounts to at most 1.4 times the ratio between the effective mass of the holes and the effective mass of the electrons.

In an embodiment, a doping concentration of said nanowire laser structure may vary along a lengthwise direction of said nanowire laser structure. A lengthwise direction may be a direction facing away from said substrate. A varying doping concentration may counterbalance the higher electron mobility, and thereby prevent radiative recombination from happening predominantly at the anode end of the nanowire.

For instance, an n-type doping concentration may be higher in the elongated support element and/or elongated body element at a cathode end, and may be lower at an anode end. In particular, an n-type doping concentration of said support element and/or said body element may decrease gradually from the cathode end of said nanowire laser structure to an anode end of said nanowire laser structure.

Said second semiconductor region may additionally comprise an inner area facing said support element and an outer area facing away from said support element, wherein a doping concentration of said inner area is different from a doping concentration of said outer area.

In particular, said doping concentration of said inner area may be higher than a doping concentration of said outer area, and preferably at least 5 times higher than a doping concentration of said outer area and in particular at least 10 times higher.

A higher doping concentration in said inner area may serve to trap electrons and radiative recombination inside said support element and body element. This higher doping concentration may prohibit the radiative recombination spreading away from the center of the nanowire, which could otherwise occur due to the high electron mobility when using an n-doped core.

In an embodiment, the nanowire laser structure further comprises an intrinsic semiconductor region sandwiched between said first semiconductor region and said second semiconductor region.

Almost all recombination of electrons and holes may take place in said intrinsic layer sandwiched between said first semiconductor region and said second semiconductor region. This may further focus the carrier density into a single region, therefore increasing radiative recombination. It may also reduce SRH-recombination due to the lower defect density within the intrinsic region.

Said support element and/or said body element may be cylindrical, or hexagonal or triangular.

Said first diameter of said support element may denote a distance between opposite side surfaces of said support element.

In intrinsic units, when said nanowire laser structure is adapted to emit a laser signal at a wavelength $\lambda$, said first diameter of said support element may be smaller than $\lambda/(2n)$, wherein n denotes an index of refraction of said support element.

A diameter smaller than $\lambda/(2n)$ prevents laser modes from forming inside said support element, and hence prevents direct coupling of the laser mode to the substrate, thereby avoiding direct contact of the laser mode with the underlying silicon substrate and enhancing the reflectivity.

In an example, said first diameter may be smaller than 400 nm, preferably smaller than 300 nm, and in particular smaller than 200 nm.

Said second diameter of said body element may be an outer diameter, and may denote a distance between opposite outer side surfaces of said body element.

In an embodiment, said nanowire laser structure may be adapted to emit a laser signal at a wavelength $\lambda$, and said second diameter of said body element may be no smaller than an optical cut-off diameter for optical modes of said body element. The optical cut-off diameter can be understood, in the context of the present disclosure, as a lower bound of the wavelengths that are able to propagate within said body element.

In an embodiment, said nanowire laser structure may be adapted to emit a laser signal at a wavelength $\lambda$, and said second diameter of said body element may be no smaller than $\lambda/n$, in particular no smaller than $1.5\lambda/n$, wherein n denotes an index of refraction of said body element.

A diameter of said body element being no smaller than $\lambda/n$ ensures that laser modes may form in said body element, spaced apart from said substrate, thereby enhancing the confinement and the spontaneous emission factor.

In an example, said second diameter of said body element may be no smaller than 150 nm, preferably no smaller than 300 nm, and in particular no smaller than 400 nm.

In an embodiment, said nanowire laser structure is adapted to emit a laser signal at a wavelength $\lambda$, wherein said second diameter of said body element is no larger than $3\lambda/n$, and preferably no larger than $2\lambda/n$, wherein n denotes an index of refraction of said body element. This allows to provide a nanowire laser structure with a well-defined laser wavelength. Furthermore, this allows to provide a nanowire structure with a high spontaneous emission factor and, thus, a high efficiency.

In the context of the present disclosure, the wavelength $\lambda$ of the laser signal may be determined in terms of a length of said elongated body element, which may serve as a resonating cavity for said laser signal. In particular, the length of said body element may be an integer multiple of $\lambda/(2n)$, wherein n denotes an index of refraction of said body element.

In an example, a length of said body element is no smaller than 0.5 μm, in particular no smaller than 1 μm.

The inventors found that a cavity length in that range may efficiently suppress losses, and thereby enhances the gain for lasing.

In an embodiment, the length of said body element is no larger than 50 μm.

In an embodiment, the nanowire laser structure further comprises a second reflective layer formed on a side of said body element facing away from said substrate.

A second reflective layer on an upper side of said body element opposite from said substrate may further enhance the reflective properties, and may provide a particularly efficient cavity for lasing.

In particular, said second reflective layer may comprise a distributed Bragg reflector and/or a high contrast grating.

In an embodiment, the nanowire laser structure further comprises first polarization means electrically connected to said substrate and adapted to raise said substrate to a first potential, and second polarization means electrically connected to said body element and adapted to raise said body element to a second potential different from said first potential.

The first and second potential may be applied to the nanowire laser structure to provide an electrical injection, thereby triggering the lasing in said body element.

Preferably, said first polarization means and/or said second polarization means may be integrated into said nanowire laser structure and may be fabricated by means of semiconductor fabrication techniques. In particular, a heavily-doped thin $p^{++}$-contact or an $n^{++}$-contact may be used for electrical injection.

In an embodiment, said substrate comprises a waveguide, and said support element extends from said waveguide.

A waveguide in the substrate allows to conveniently couple out the laser signal, and transfer it elsewhere on the chip where it is needed.

Said waveguide may comprise silicon.

In an example, said waveguide comprises a scattering object placed underneath said support element and/or said body element. In particular, a lithographically defined grating may be placed underneath said support element and/or said body element.

Said scattering object may be an asymmetrical scattering object, which is adapted to scatter light along a preferred direction.

In an embodiment, said support element and/or said body element extend in a direction perpendicular to said substrate.

However, the invention is not so limited, and said support element and/or said body element may alternatively extend at an angle inclined to a surface normal of said substrate.

An inclined configuration may increase the coupling efficiency between the body element and the underlying waveguide, in particular for helical modes. Moreover, an inclined support element and/or body element allows to couple out the laser signal in a preferred directionality.

In an example, said angle inclined to a surface normal of said substrate may amount to at least 20 degrees, and in particular at least 70 degrees.

In an embodiment, said nanowire laser structure further comprises an interferometer element optically coupled to said body element, wherein said interferometer element comprises a first laser signal path and a second laser signal path that together form a closed loop, and said nanowire laser structure further comprises an output path coupled to said first laser signal path and said second laser signal path, and a gate element located in said second laser signal path, wherein said gate element is adapted to selectively change a refractive index of said second laser signal path.

The interferometer element coupled to said body element may serve as an optical cavity and allows to store coherent light. Laser light emitted from said body element may interfere destructively at the output of the optical cavity in a first gate position of said gate element. However, in a second gate position of said gate element, a refractive index of said second laser signal path may change, leading to a constructive interference of light at the output of the optical cavity, and hence to a sudden emission of the light energy stored in said laser cavity. This may result in an ultrafast pulse emission, and may be employed in the design of frequency combs.

In an example, said gate element comprises a non-linear medium.

In another example, said nanowire laser structure further comprises a feedback path that couples said output path to said gate element, in particular an optical feedback path.

Said feedback path allows the light emitted into said output path to trigger a subsequent output pulse. This configuration allows for the emission of a train of short laser pulses at regular short intervals, thereby facilitating the frequency comb generation.

Several nanowire laser structures with some or all of the features described above may be formed on a common substrate, resulting in a laser array.

In particular, said laser array may comprise a plurality of nanowire laser structures spaced at regular intervals.

Adjacent body elements in said laser array may be separated by a dielectric medium.

In an embodiment, the laser array further comprises cooling channels for a cooling medium, said cooling channels extending between adjacent nanowire laser structures.

The cooling channels may help to efficiently dissipate heat generated in said laser array, and hence may assist in providing a laser array with high laser output.

In an example, said nanowire laser structures may be formed at varying spatial distances on said common substrate. By tailoring a separation between adjacent body elements, and hence the constructive and destructive interference between the laser signals emitted by the individual body elements, the far field emission profile of the array can be selectively determined.

Individual adaption of the far field emission profile and fast switching between various configurations can be achieved with individually contacted nanowires in a given nanowire array structure. Instead of or in addition to varying the nanowire positions, individual nanowires can be switched on or off, or can be regulated in laser intensity.

Said nanowire laser structures of said laser array may differ in terms of their optical properties. In particular, different nanowire laser structures of said laser array may have different dimensions, and hence emit laser signals at different wavelengths.

In an embodiment, said laser array further comprises at least one focusing element, said at least one focusing element being placed on said plurality of nanowire laser structures at a side facing away from said common substrate.

The at least one focusing element may assists to further enhance the directionality of the emitted laser signal.

Said focusing element may comprise a lens, in particular a solid immersion lens and/or a microlens array.

The invention further relates to the use of a said nanowire laser structure or said laser array for emitting a laser signal at a wavelength $\lambda$.

In particular, the use may comprise the steps of applying a first voltage to said substrate, and applying a second voltage to said body element, said second voltage being different from said first voltage.

The nanowire laser structure may be a nanowire laser structure with some or all of the features described above.

The invention further relates to a method for forming a nanowire laser structure, comprising the steps of forming a first reflective layer on a substrate layer, forming a hole in said first reflective layer, said hole extending to said substrate layer, and growing a nanowire laser structure in said hole, wherein growing said nanowire laser structure comprises growing a support element in said hole through said first reflective layer at a first diameter, and extending said support element above said first reflective layer at said first diameter, and afterwards growing a body element around at least a portion of said support element that extends above said first reflective layer, said body element having a second diameter at least two times larger than said first diameter.

Said method may further comprise a step of providing and/or forming said substrate layer.

In an embodiment, said method further comprises a step of forming a resist layer on said first reflective layer, forming said hole through said resist layer, and removing said resist layer from said first reflective layer after forming said hole.

Employing resist layers may allow to select said positions of said elongated support elements, and hence said nanowires on said substrate with a high degree of accuracy. However, resist-less fabrication methods, such as focused ion beam or helium-ion lithography may also be employed.

In an example, said forming said hole comprises a step of forming a first hole in said first reflective layer by means of an anisotropic reactive ion etching, wherein said first hole terminates within said reflective layer, and afterwards extending said first hole to said substrate layer by means of a chemical etching, in particular a hydrofluoric acid etching.

The two-step etching of the embodiment has several advantages. Stopping said anisotropic reactive ion etching within said first reflective layer prevents damage to the underlying substrate surface, which could hinder the nucleation and growth of the nanowires in the subsequent growing step. Extending said first hole to said substrate layer may then proceed with an etching rate that can be carefully adjusted and allows to terminate the etching right at the substrate interface, thereby avoiding underetching and providing a smooth crystalline surface on which the nanowires can subsequently be grown in high quality.

Said hole may be formed with a depth that corresponds to an integer multiple of $\lambda/(2 \cdot n)$, wherein $\lambda$ denotes a wavelength of a laser signal that said nanowire laser structure is adapted to emit, and n denotes an index of refraction of said first reflective layer.

In an example, said hole is formed with a depth of at least 150 nm, preferably at least 200 nm.

Said nanowire laser structure may be grown by means of molecular beam epitaxy, chemical beam epitaxy, vapor phase epitaxy, or metal organic chemical vapor deposition.

In an embodiment, the method further comprises the step of doping said support element and/or said body element to form a pn junction or a pin junction.

Said nanowire laser structure may be a nanowire laser structure with some or all of the features described above.

DETAILED DESCRIPTION OF EXAMPLE EMBODIMENTS

The features and numerous advantages of the nanowire laser structure and fabrication method will best become apparent from a detailed description of example embodiments with reference to the accompanying drawings, in which:

FIG. 1 schematically shows a cross-section of a nanowire laser structure according to an example of the invention;

FIGS. 6a and 6b illustrate waveguide coupling using helical modes with a nanowire laser structure according to an example;

FIG. 7a illustrates how the coupling of optical nanowire laser modes to the waveguide may be enhanced with a scattering object underneath the nanowire;

FIG. 7b illustrates how light transmitted through the bottom reflection layer may be diffracted by means of a lithographically defined grating underneath the nanowire to enhance the waveguide coupling;

FIG. 7c illustrates how a tilted nanowire may increase the coupling efficiency for optical modes to the on-chip waveguide;

Figure 1:
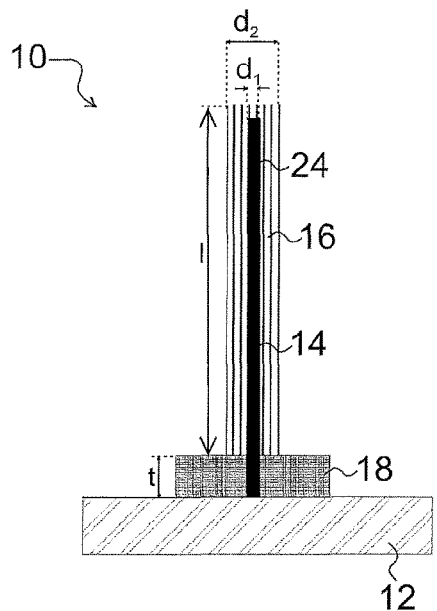

FIG. 1 shows a cross-section of a nanowire laser structure 10 according to an example of the invention. The nanowire laser structure 10 comprises a substrate 12, such as a silicon substrate, in particular with a (100) silicon surface or a (111) silicon surface. The nanowire laser structure further comprises an elongated support element 14 (shown in black) extending vertically from the silicon substrate 12. An elongated body element 16 (shown hatched area in FIG. 1) is formed on and around the support element 14.

In the configuration of FIG. 1, the support element 14 extends through the body element 16, and hence serves as a core of the nanowire laser structure 10. The body element 16 extends around the support element 14, and hence can be considered a shell of the nanowire laser structure 10.

In an example, the support element 14 and the body element 16 are both formed from a III-V semiconductor, such as GaAs, InGaAs, InP, and/or GaP. However, the choice of the material depends on the desired application, and in other configurations a II-VI semiconductor and/or a group-III nitride, in particular GaN and/or AlGaN may likewise be employed.

Both the support element 14 and the body element 16 may be cylindrical or hexagonal or triangular. However, depending on the materials used in the fabrication process, other shapes may likewise be employed.

As can be taken from FIG. 1, contrary to the support element 14, the body element 16 does not extend all the way down to the substrate 12, but is separated from the substrate 12 by means of a first reflective layer 18 that surrounds the lower part of the support element 14 and extends between an upper surface of the substrate 12 and a lower surface of the body element 16. For instance, the first reflective layer 18 may be formed of a dielectric material such as $SiO_2$ and/or SiN.

The dimensions of the nanowire laser structure 10 are chosen in accordance with the laser wavelength of the laser signal that the nanowire laser structure 10 is supposed to emit. For instance, a diameter $d_1$ of the support element 14 may be chosen smaller than $\lambda/(2 \cdot n)$, when n denotes an index of refraction of the support element 14. A diameter $d_1 < \lambda/(2 \cdot n)$ prevents laser wavelengths from forming and resonating within the support element 14, and hence prevents direct contact or coupling of these laser wavelengths with the underlying substrate 12 on which the support element 14 is formed.

An outer diameter $d_2$ of the body element 16 may be at least two times larger than the diameter $d_1$ of the support element 14, and in particular may amount to at least $\lambda/n$, wherein n denotes an index of refraction of the body element 16. Laser wavelengths may foist and resonate along the lengthwise direction 1 of the body element 16. The body element 16 thus serves as a laser cavity.

Depending on the laser wavelength, the diameter $d_1$ of the support element 14 may be in the range between 80 nm and 300 nm. Correspondingly, the diameter $d_2$ of the body element 16 may amount to at least 160 nm, in particular at least 400 nm or at least 600 nm.

The first reflective layer 18 serves to reflect the laser modes at the lower end of the body element 16, and therefore provides resonant recirculation of the optical modes for lasing of the nanowire structure 10. The inventors found that the first reflective layer 18 enhances the modal reflectivity at the nanowire interface and enables reflectivities of 0.9 and beyond, two to three orders of magnitude higher than what could be obtained by reflecting the laser modes directly off the silicon substrate 12. The small nanowire waveguide (body element 16) provides low order waveguiding with beta factors of 0.2 and beyond. Even though the nanowire structure 10 is anchored directly to the silicon substrate 12 via the support element 14, it hence maintains excellent wave-guiding properties with reflectivities larger than 90% due to the separation of the body element 16 from the substrate 12 by means of the first reflective layer 18.

Preferably, a thickness t of the first reflective layer 18 may be chosen as an integer multiple of $\lambda/(2 \cdot n)$, wherein n denotes an index of refraction of the first reflective layer 18. This thickness allows reflection both on an upper surface side of the first reflective layer 18 at the interface with the body element 16 and on a lower surface side of the first reflective layer 18 at the interface with the underlying substrate 12, and thereby further enhances the reflective properties.

Depending on the desired laser wavelength, the thickness t of the first reflective layer 18 may be chosen in the range between 100 nm and 800 nm.

A length l of the body element 16 may amount to at least 1 µm. With a cavity length of at least 1 µm, the inventors found that losses may be efficiently suppressed. If the reflectivity of the first reflective layer 18 is particularly good, even shorter body elements may be used.

Figure 2:
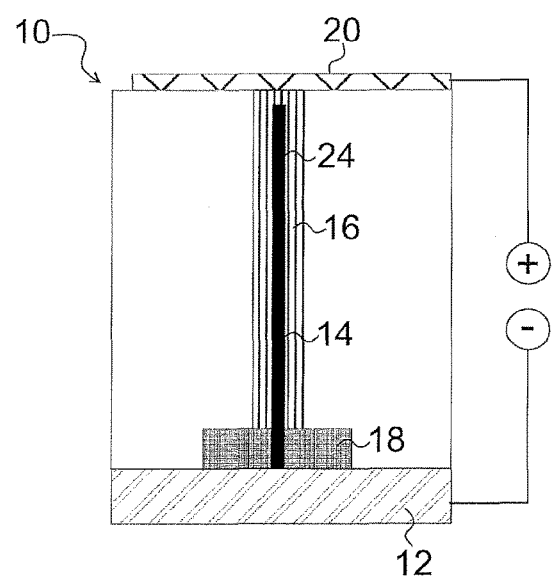
FIG. 2 shows the nanowire laser structure of FIG. 1 with electrical contacts.

FIG. 2 is a cross-section of the same nanowire laser structure 10 depicted in FIG. 1, but in addition shows the electrical contacts for triggering the electrical injection into the nanowire laser structure 10. The cathode may be connected to the substrate 12, and is in electrical contact with the body element 16 via the support element 14. The anode contact may be a contact layer 20 in electrical contact with the body element 16. FIG. 2 shows the anode contact layer 20 formed on top of the body element 16. However, this is just an example, and the contact layer 20 may also be provided at or around an upper side surface of the body element 16. The electrical contact layer 20 can be a thin metallic layer, such as Au, Cu, or Ti that enables sufficient transmission, or can be formed of a transparent conducting material such as indium tin oxide (ITO). The contacts are preferably Ohmic.

A metallic contact layer 20 may double as a second reflective layer at the top of the body element 16, and may thereby further enhance the confinement, and thus further lower the lasing threshold.

Figure 3:
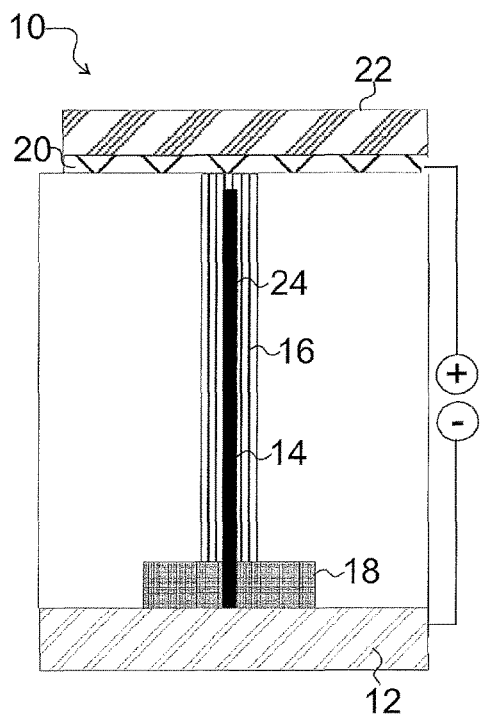
FIG. 3 illustrates the nanowire laser structure according to the example of FIG. 2 with an additional top reflection layer.

However, a separate second reflective layer 22 may likewise be formed on an upper side of the body element 16, as schematically shown in the cross-section of FIG. 3. The second reflective layer 22 may extend in parallel to the first reflective layer 18, so as to enhance the reflectivity at the top facet of the nanowire. But this is an optional configuration. In general, the top facet of the nanowire laser structure 10 may provide a sufficient degree of reflectivity for many applications, and no second reflective layer 22 may be needed.

In the configurations of FIGS. 1 to 3, the first reflective layer 18 and the second reflective layer 22 may comprise a dielectric material. However, the first reflective layer 18 and the second reflective layer 22 may also comprise a distributed Bragg reflector and/or a high contrast grating, so to further enhance the reflectivity, reduce the nanowire laser threshold and hence reduce the energy consumption of the nanowire laser structure 10.

The first reflective layer 18 not only serves to provide optical feedback, but also doubles as an isolation layer between the substrate 12 and the body element 16.

In the configurations of FIGS. 1 to 3, the support element 14 may be n-doped and the body element 16 may be p-doped, resulting in a radial pn-junction 24 extending along the length of the nanowire laser structure 10. For instance, the support element 14 may be n-doped with a doping concentration of $10^{19}/cm^3$, and the body element 16 may be p-doped with a doping concentration of $10^{20}/cm^2$. The n-doped support element 14 is in electrical contact with the cathode while the substrate 12, and the p-doped body element 16 is in electrical contact with the anode via the contact layer 20. Hence, current may be injected along the radial pn-junction. Due to the large surface-to-volume ratio of the nanowire laser structure 10, a large depletion region extends along the entire nanowire axis, resulting a strong enhancement of the nanowire laser efficiency by suppressing non-radiative recombination losses and leakage current. An additional intrinsic layer can be sandwiched in between the n- and the p-doped layer.

Figure 4:
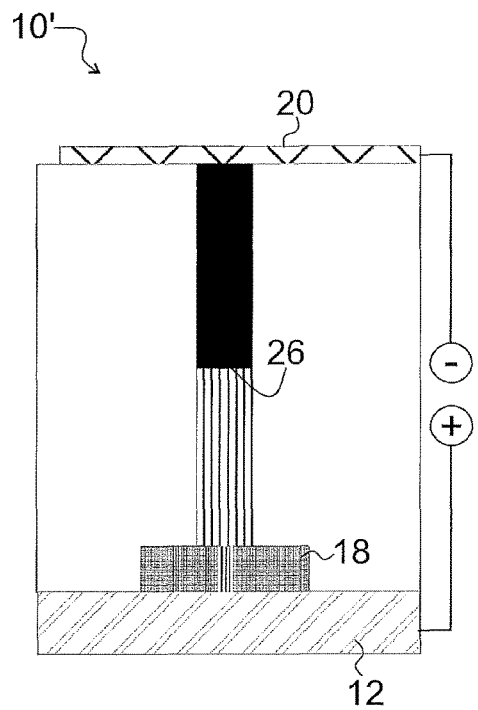
FIG. 4 shows a cross-section of a nanowire laser structure according to another example, comprising a lateral p-n-junction.

However, a lateral pn-junction may also be employed, as shown in FIG. 4. FIG. 4 is a cross-section of a nanowire laser structure 10' that largely corresponds to the configuration described above with reference to FIGS. 1 to 3, and the same reference numerals are employed to designate corresponding parts. However, in contrast to the nanowire laser structure 10, an upper portion (shown in black) of the support element 14 and body element 16 of the nanowire laser structure 10' is n-doped, whereas a lower portion (shown hatched) of the nanowire laser structure 10' is p-doped, resulting in a lateral pn-junction 26 between the n-doped upper portion and the p-doped lower portion. Again, an n-type doping concentration may be chosen in the range of $10^{19}/cm^3$ and a p-type doping concentration in the range of $10^{20}/cm^3$. An additional intrinsic layer can be sandwiched in between the n- and the p-doped layer.

The n-doped upper portion may be connected to the cathode via the electrical contact layer 20, whereas the p-doped lower portion may be connected to the anode via the substrate 12 and support element 14, allowing current to be injected into the nanowire laser structure 10 at the lateral pn-junction.

As described above, in a nanowire laser structure according to the invention, the diameter $d_2$ of the body element may define the optical mode that is supported by the nanowire waveguide. The length l of the body element 16 in the nanowire material may define the laser wavelength which resonates with the desired optical mode. In an example, the diameter $d_2$ of the body element 16 is chosen no larger than two times the laser wavelength $\lambda/n$ in the body element 16 with index of refraction n. Typically, the diameter $d_2$ of the body element 16 can be chosen in the range of 100 to 800 nm, depending on the laser wavelength. The first reflective layer 18 may be chosen at a thickness t in the range of 50 to 400 nm, and likewise depends on the optical mode and on the laser wavelength $\lambda$.

The electrical properties of the nanowire laser structures 10, 10', the electrical contacts and doping profiles can be adjusted and tailored to the desired optical laser modes. In order to achieve an efficient population inversion in the nanowire cavity, the carrier recombination can be spatially matched with the optical mode along the entire nanowire so to minimize residual parts without radiative recombination that could act as absorber regions and therefore contribute to losses. Given that electrons typically have a much higher mobility than holes, electrons carry most of the electric current along the nanowire. As a result, most radiative recombination takes place at the anode.

The inventors found that this effect may be counterbalanced with a graded doping structure along the support element 14. For instance, an n-type support element 14 may be strongly doped in the vicinity of the cathode, with a doping concentration in the range of $10^{20}/cm^3$, and gradually more lightly doped towards the anode, reaching a doping concentration in the range of $10^{17}/cm^3$ in the vicinity of the anode. The graded doping may reduce the electron current to the anode end of the nanowire, and may therefore lead to a more homogeneous recombination, and hence a more efficient nanowire laser structure with superior optical properties.

A high electron mobility may also lead to radiative recombination spreading away from the center of the nanowire laser structure, which may result in a suboptimal overlap with the electromagnetic field of the fundamental optical mode. This effect can be countered with the use of two different dopings in the body element 16. A thin, highly p-doped layer in an inner part of the body element 16, adjacent to the support element 14, may trap electrons and radiative recombination at the center of the nanowire laser structure. For improved electrical conductivity, the outer area of the body element 16 may also be p-doped, but to a lesser degree.

Figure 5:
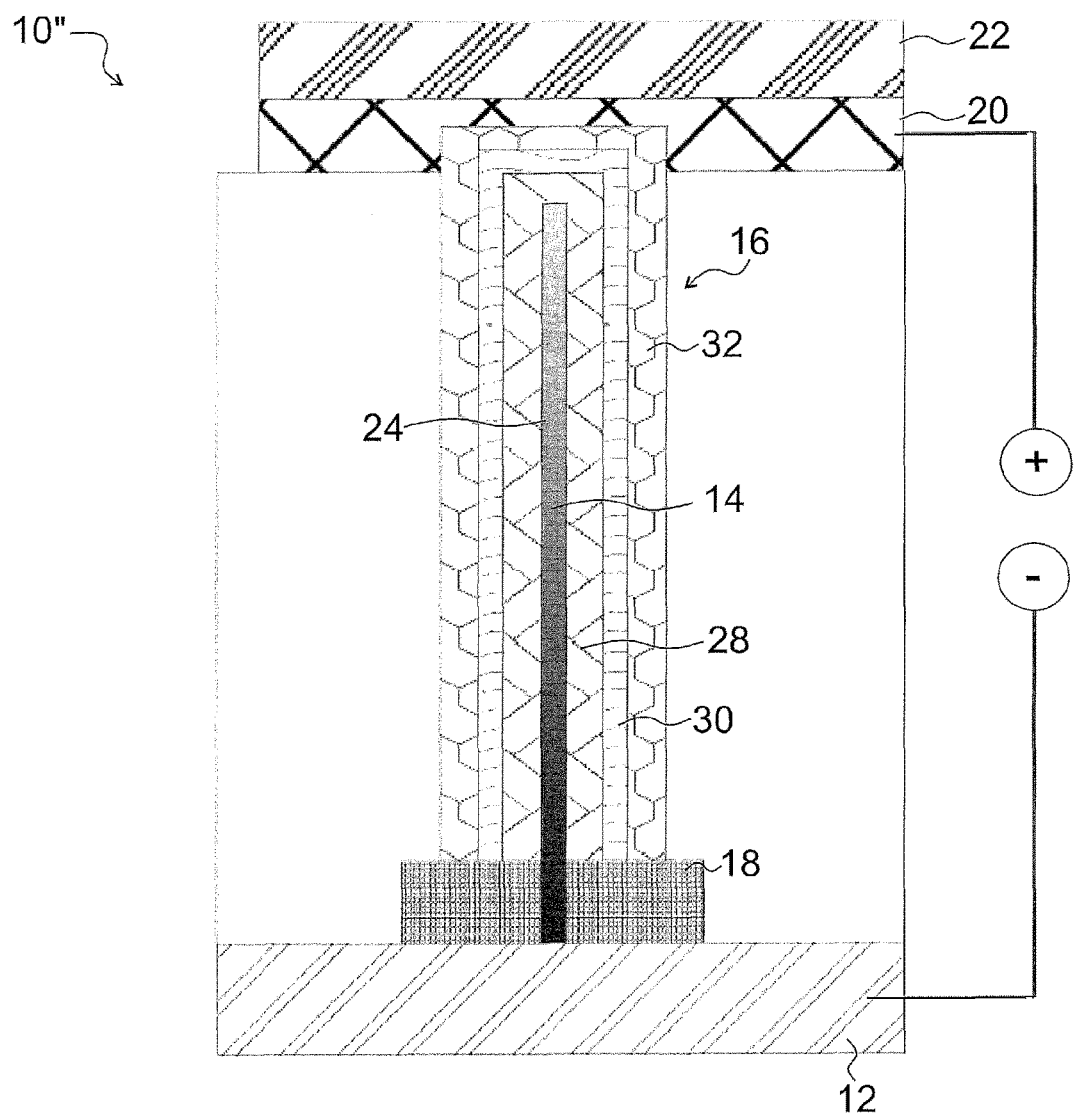
FIG. 5 is a cross-section of a nanowire laser structure according to another example, comprising an n-i-$p^{++}$-p doping structure.

FIG. 5 is a cross-sectional view of a nanowire laser structure 10" that generally corresponds to the nanowire laser structure 10 described above with reference to FIGS. 1 to 3, but features both a graded doping in the support element 14 and a barrier layer in the body element 16.

As illustrated in FIG. 5 by means of a darker shading, the support element 14 is more strongly n-doped at the cathode end of the support element 14, hence in the vicinity of the substrate. The level of the n-type doping may decrease gradually, such as logarithmically, from $10^{20}/cm^3$ at the cathode end to $10^{17}/cm^3$ at the anode end of the support element 14.

As can be taken from FIG. 5, the nanowire laser structure 10" has a radial n-i-p$^{++}$-p doping structure. The body element 16 comprises an intrinsic layer 28 that extends as a shell around the graded n-doped support element 14, which in turn is surrounded by a highly p-doped barrier layer 30 with a p$^{++}$ doping concentration in the range of $10^{19}$ to $10^{20}/cm^3$ for trapping electrons and radiative recombination at the nanowire center. An outer layer 32 is more lightly p-doped, with a doping concentration in the range of $10^{17}$ to $10^{19}/cm'$ for improved electrical conductivity.

All other components of the nanowire laser structure 10" largely correspond to those described in detail above with reference to FIGS. 1 to 3, and hence a detailed description is omitted.

Configurations with a n-doped support element 14 and a p-doped body element 16 have been described above with reference to FIGS. 1 to 3 and FIG. 5. However, the disclosure is not so limited, and likewise comprises the inverse configurations with a p-doped support element 14 surrounded by a n-doped body element 16, optionally with an intrinsic layer sandwiched in between.

In an exemplary inverse configuration, the p-doped support element 14 may be uniformly doped, and a doping concentration of the n-doped body element 16 may decrease gradually from the cathode end to the anode end of the nanowire structure. A doping of the substrate 12 may also be inversed.

FIGS. 6a, 6b and 7 illustrate techniques for coupling out the laser signal from the nanowire laser structure.

FIG. 6a shows a nanowire laser structure 10 that generally corresponds to the configuration of FIG. 2, and the same reference numerals are used to designate corresponding components. However, the substrate 12 of the nanowire laser structure 10 shown in FIG. 6a comprises an additional waveguide layer 34 in contact with the support element 14 and the first reflective layer 18. The waveguide layer 34 may form the uppermost layer of the substrate 12, and may comprise a high refractive index growth substrate such as silicon with a thickness comparable to the nanowire emission wavelength λ/n. Whereas the first reflective layer 18 acts as a base reflection layer for the nanowire laser, as described above, the high refractive index waveguide layer 34 maintains the waveguide and properties of the growth substrate.

Given that the nanowire laser shown in FIG. 6a is grown vertically on the waveguide 34, and hence perpendicularly to the waveguide layer 34 underneath, one might intuitively expect the coupling of the guided modes in the body element 16 to the perpendicular waveguide layer 34 to be low. However, already second, third, and fourth order waveguide modes inside the body element 16 have a strong helical character, and hence a significant in-plane wave vector component. The inset of FIG. 6b is a schematic cross-section of the helical modes HE11, HE21, HE31, and HE41 supported by the body element 16. The steep angle of incidence of these modes results in a high reflectivity at the first reflective layer 18, which reduces the threshold and causes a preferential emission into the in-plane waveguide layer 34. The preferred optical modes can be tailored by the diameter of the body element 16.

The coupling to the underlying waveguide layer 34 can be further enhanced by placing a scattering object 36 in the waveguide layer 34 at a position underneath the body element 16, as schematically illustrated in FIG. 7a. The scattering object 36 could either be etched in the waveguide layer 34 or deposited by means of lithography or nano imprint technologies. In particular, the scattering object 36 may be an asymmetrical scattering object that emits light in a pre-defined preferential direction, such as indicated by the arrow in FIG. 7a.

An example in which a grating 38 serves to enhance the coupling between the body element 16 and the waveguide layer 34 is shown in FIG. 7b. As can be taken from FIG. 7b, the grating 38 extends through the waveguide layer 34 and the first reflective layer 18 and surrounds the lower portion of the support element 14. The grating 38 causes diffraction of the transmitted nanowire light. The zero order mode will be reflected back into the body element 16 and contributes to lasing, whereas higher order diffraction modes may efficiently enter the horizontal waveguide layer 34, thereby increasing the coupling efficiency.

In the examples described above, the support element 14 and body element 16 extend along a normal direction of an upper surface of the substrate 12. This configuration may result from the growth of the support element 14 on a silicon (111) surface. However, other growth substrates such as a silicon (100) surface can be used to grow tilted nanowires, as schematically shown in FIG. 7c. The configuration of FIG. 7c largely corresponds to the configuration of FIG. 6a, with the distinction that the nanowire comprising the support element 14 and the body element 16 is inclined at an angle α with respect to the surface normal N of the substrate 12 and first reflective layer 18. In the case of growth on a silicon (100) surface, the angle α may amount to approximately 71 degrees.

Tilted nanowires as depicted in FIG. 7c typically emit at an angle that undergoes total internal reflection inside the waveguide layer 34, and hence achieves higher coupling efficiencies. Moreover, the configuration of FIG. 7c preferentially emits in a single direction (to the right, as indicated by the arrow in the waveguide layer 34), which may be desirable in some applications.

In some embodiments, the waveguide layer 34 may be formed of a semiconductor material, such as Si and the electrical connections for driving the nanowire laser structure may be applied directly to the waveguide layer 34, thereby establishing an electrical contact with the support element 14 extending from the waveguide layer 34.

In alternative configurations, the support element 14 may extend through the waveguide layer 34 to the underlying substrate 12, and the electrical connections may be provided at the substrate 12.

In the configurations described above with FIGS. 1 to 7c, the nanowire laser structure 10, 10', 10" may be surrounded by or embedded into a dielectric bulk substrate for enhanced structural stability. The dielectric bulk substrate may support the contact layers for establishing an electrical contact, such as contact layer 20. The dielectric bulk layer may also contain the circuit paths for the electrical connections. Preferably, a material with a low index of refraction can be employed, such as $SiO_2$ or a polymer.

Embodiments have so far been described with reference to a single nanowire grown on a substrate. However, it is a particular advantage of the present invention that the structure and fabrication techniques are highly scalable and can be employed to provide large arrays of nanowire laser structures.

Figure 8:
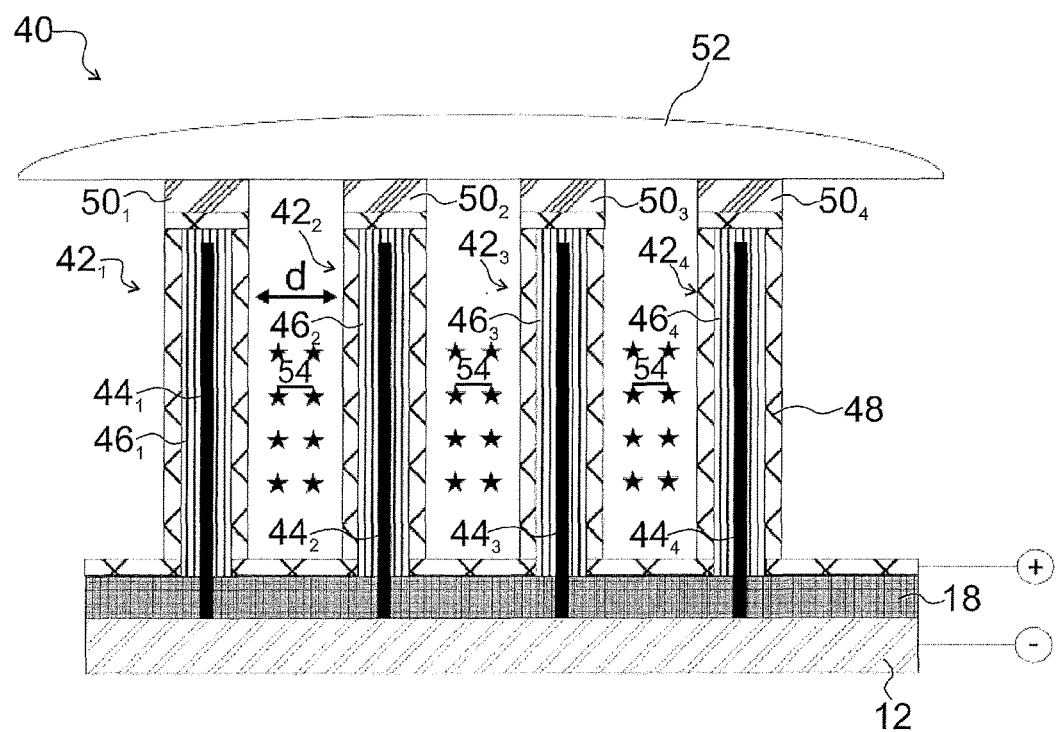
FIG. 8 illustrates a nanowire laser array comprising a plurality of nanowire laser structures according to an example.

FIG. 8 is a cross-sectional view of a nanowire laser array 40 comprising a plurality of nanowire laser structures 42 on a common substrate 12. In the configuration of FIG. 8, four nanowire laser structures $42_1$ to $42_4$ are shown. However, this is merely for illustration, and in practice the nanowire laser array 40 may comprise thousands or even millions of nanowire laser structures on the common substrate 12.

As can be taken from FIG. 8, each of the nanowire laser structures $42_1$ to $42_4$ generally corresponds to the configurations described above with reference to FIGS. 1 to 3, with n-doped support elements $44_1$ to $44_4$ and p-doped body elements $46_1$ to $46_4$ surrounding the respective support elements $44_1$ to $44_4$.

The support elements $44_1$ to $44_4$ are electrically connected to the cathode via the common substrate 12. Moreover, FIG. 8 shows a common metal contact layer 48 covering the outer surfaces of each of the body elements $46_1$ to $46_4$ and extending in between adjacent nanowire laser structures $42_1$ to $42_4$. The common contact layer 48 is electrically coupled to the anode, and hence allows a common anode potential to be applied to each of the body elements $46_1$ to $46_4$ of the nanowire laser structures $42_1$ to $42_4$. However, this is just an example, and in other configurations the nanowire laser structures $42_1$ to $42_4$ may be contacted and addressed individually rather than collectively.

As can be further taken from FIG. 8, each of the nanowire laser structures $42_1$ to $42_4$ is provided at an upper face with a respective top reflection layer $50_1$ to $50_4$. Each of the top reflection layers $50_1$ to $50_4$ may correspond in material and design to the second reflective layer 22 described above with reference to FIG. 3.

Each of the nanowire laser structures $42_1$ to $42_4$ may be driven to emit laser light at respective wavelengths $\lambda_1$ to $\lambda_4$. In some configurations, the wavelengths $\lambda_1$ to $\lambda_4$ may coincide, whereas in other configurations, different nanowire laser structures $42_1$ to $42_4$ of the nanowire laser array 40 may be adapted and driven to emit different wavelengths $\lambda_1$ to $\lambda_4$. The nanowire laser array 40 may hence be employed as a semi-coherent light source on the nanoscale, enabling large-scale nanowire laser devices that could replace today's semiconductor lasers and have the potential of being several orders of magnitude more energy and cost efficient.

The constructive and destructive interference between the individual nanowire laser structures $42_1$ to $42_4$ of the nanowire laser array 40 determines the far field emission profile of the nanowire laser array 40, and may be adapted and tailored by carefully choosing the separations d between adjacent nanowire laser structures and their relative positions on the common growth substrate 12. Such a nanowire laser array 40 could serve as a very efficient light projector.

Assuming a pitch d=50 nm between adjacent nanowire laser structures $42_1$ to $42_4$, the monolithic integration of 400 million nanowire lasers on a single 1 cm×1 cm piece of silicon wafer could be fabricating requiring only a single growth. From their measurements, the inventors estimate that a single nanowire laser may emit at least 20 nW, and hence the 1 cm×1 cm piece of nanowire lasers could therefore easily emit in the range 8 W of coherent optical power.

In order to additionally tailor the emission profile of the array 40, a lens configuration may be employed, such as a microlens array or a solid immersion lens 52 placed on top of a plurality of top reflection layers $50_1$ to $50_4$, as schematically illustrated in FIG. 8.

Compared to an array of LED diodes, nanowire laser structures emit point-like, and hence can reach a significantly higher luminosity. In order to form the far field with the help of a micro lens array, techniques known from LEDs can be employed such as those described in M. Sieler et al., "Design and realization of an ultra-slim array projector", Microopics Conference (MOC), 2011 17th, 1-4. IEEE, 2011, and "Ultraslim fixed pattern projectors with inherent homogenization of illumination", Applied optics 51, Nr. 1 (2012): 64-74.

Nanowire laser arrays on silicon as described with reference to FIG. 8 could highly reduce the material costs and energy consumption of today's semiconductor laser devices. Moreover, their large surface-to-volume ratio is useful for dissipating heat which typically limits the maximum output power of conventional semiconductor laser devices. In addition, cooling channels 54 could be formed between adjacent nanowire laser structures $42_1$ to $42_4$ for supporting the flow of a cooling medium such as air, water, liquid nitrogen, or even liquid helium. The use of cooling channels 54 could further enhance the energy dissipation, and hence could allow to reach an ever higher laser output power.

In the examples described above with reference to FIGS. 1 to 8, the nanowire laser structures 10, 10', 10" and the nanowire laser array 40 have been employed for emitting laser light, hence as a light sender. However, it will be evident for one skilled in the art that the same configuration can also be used as a light receiver. This only requires the electrical connections and wiring to be inversed.

In some applications, the nanowire laser structures 10, 10', 10" or the nanowire laser array 40 may be optically coupled to an interferometer element, such as for ultrafast pulse emission, as will now be described with reference to FIG. 9.

Figure 9:
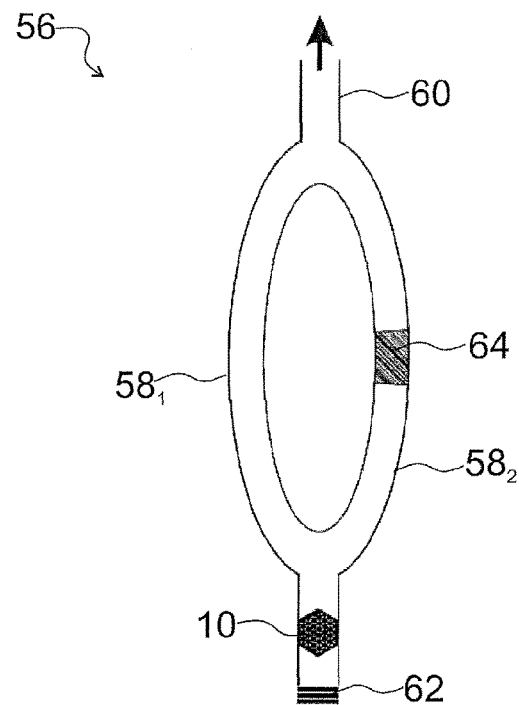
FIG. 9 is a schematic illustration of an interferometer element optically coupled to the nanowire laser structure according to an example.

In the schematic illustration of FIG. 9, the nanowire laser structure 10 is optically coupled to an interferometer element 56 comprising two branches $58_1$ and $58_2$ that together form a closed loop and are connected to a common output path 60. The branches $58_1$ and $58_2$ provide light paths for the laser light emitted by the nanowire laser structure 10. In case the branches $58_1$ and $58_2$ have exactly the same optical path length, the light paths interfere constructively at the output path 60. By providing a reflective element 62 at the opposite waveguide end, coherent laser light emitted from the nanowire laser structure 10 may be stored in the interferometer element 56. For instance, the reflective element 62 may comprise a distributed Bragg reflector.

As can be further taken from FIG. 9, an optical gate 64 can be positioned in one of the branches of the interferometer element 56, such as in the second branch $58_2$. The optical gate 64 may comprise a non-linear optical medium that can be triggered either optically or electrically, and may introduce a phase shift of 7E in the second branch $58_2$ when being activated. For instance, the gate 64 could be triggered and controlled similarly to an electro-optical modulator (EOM), which exploits non-linear effects such as the Pockels effect or the Kerr effect, and can be operated with repetition rates of several gigahertz. In both cases, the reflective index of the gate material could shift the phase of the optical field in the gated branch $58_2$ of the interferometer element 56. This could potentially also be triggered by an optical light pulse.

Assuming that the nanowire laser structure 10 emits light with a wavelength λ whereas the optical gate 64 is only sensitive to light with a wavelength at or around λ/2 and is initially deactivated, a nonlinear effect may cause a phase shift in the optical gate 64 as soon as an ignition pulse of wavelength λ/2 hits the gate 64. This will allow constructive interference at the output path 60 of the interferometer element 56, and all the energy accumulated in the interferometer element 56 can be emitted in the form of a laser pulse within a time duration that is given by L/c, wherein L is the optical path length of the interferometer element 56 and c denotes the speed of light. Assuming L=3 μm, this results in a 10 fs pulse.

Ultrafast light pulses of this type can be employed to generate frequency combs for applications in high precision spectroscopy, optical metrology, atomic clocks, or novel GPS technology. Furthermore, if generated with high repetition rates, ultrafast laser pulses could boost the speed of optical data communication.

Figure 10:
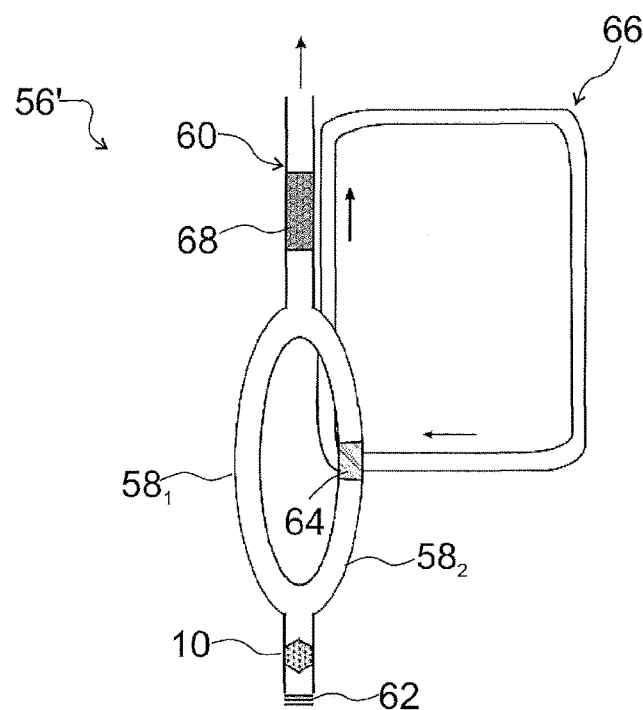
FIG. 10 illustrates the interferometer element according to the example of FIG. 9 with an additional feedback path.

FIG. 10 schematically shows an interferometer element 56' that is generally similar to the configuration described above with reference to FIG. 9, but employs an additional feedback path 66 for emitting laser pulses with high repetition rates.

The components of the interferometer element 56 generally correspond to those described above with reference to FIG. 9, and the same reference numerals are used to denote corresponding elements. But in addition, the interferometer element 56' comprises a non-linear element 68 in the output path 60. The non-linear element 68 is connected to the optical gate 64 by means of the feedback path 66. An output pulse leaving the interferometer element 56' through the output path 60 may generate a second harmonic signal in the non-linear element 68 with a wavelength λ/2 that is fed back to the optical gate 64 via the feedback path 66. As the optical gate 64 is closed again, a new pulse starts to form inside the interferometer element 56' that is continuously being pumped by the nanowire laser structure 10. When the pulse in the feedback path 66 reaches the optical gate 64, the optical gate 64 will again generate a short output pulse. The repetition rate of this configuration is given by the speed of light divided by the optical length of the feedback path 66. Assuming a 10 μm feedback path 66, this results in repetition rates in the order of 30 THz. A micro device generating 10 fs pulses with repetition rates of 30 THz is a major step towards ultrafast communication and frequency comb generation.

Example techniques for fabricating the nanowire laser structure and laser array described above will now be explained in greater detail with reference to FIGS. 11 to 13.

Site-selective growth of nanowire laser structures on semiconductor materials, in particular silicon, is of great interest for future photonic devices. To achieve sufficient reflectivities for lasing operations, thin holes to house the support elements need to be fabricated in the first reflective layer 18. As an example, holes of a diameter of approximately 80 nm may need to be fabricated into an approximately 200 nm thick $SiO_2$ layer. The challenges in this process result from the finite resistivity of the resist that is easily etched faster than the underlying first reflective layer 18.

Figure 11:
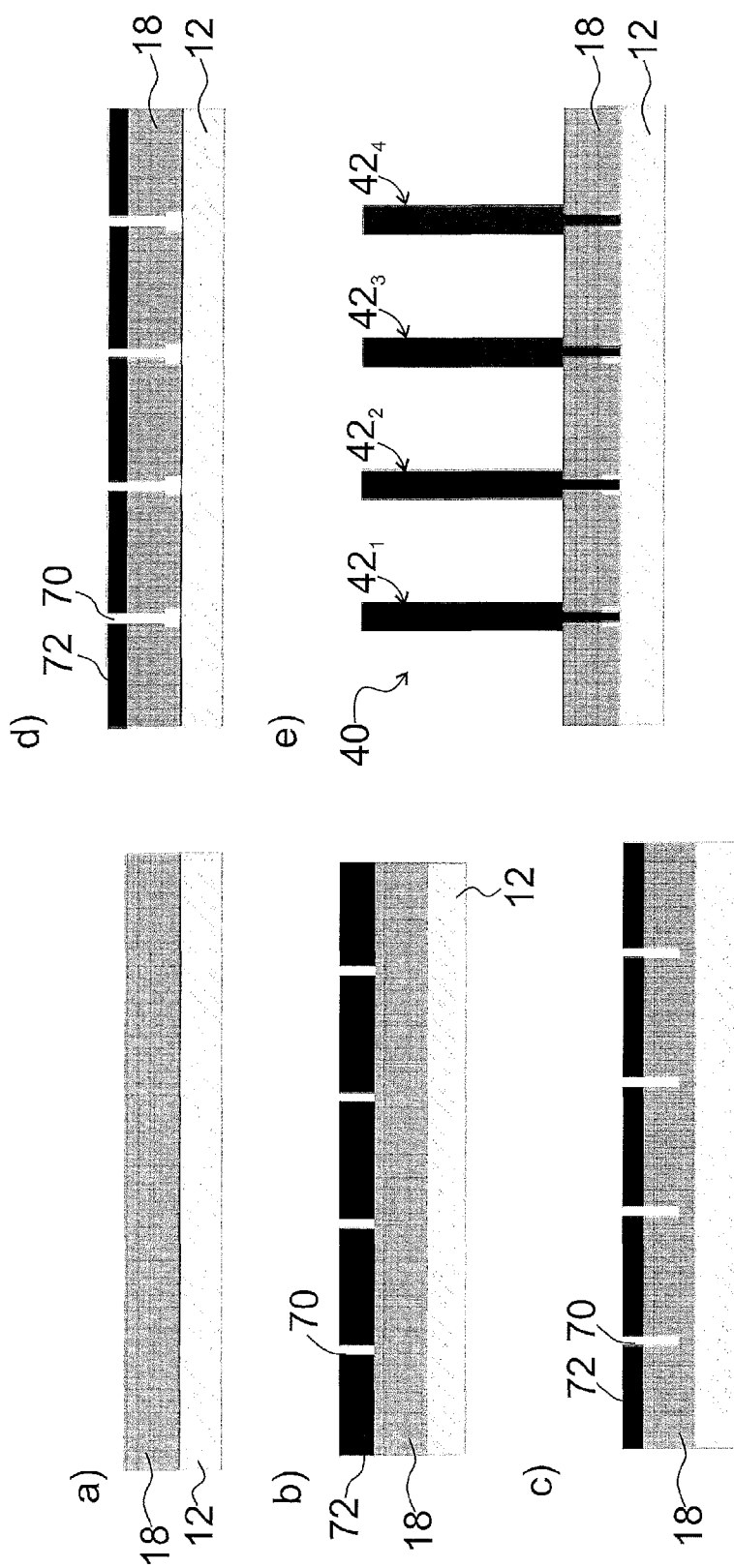
FIGS. 11a to 11e illustrate steps of a fabrication method for forming a nanowire laser structure according to an example.
Figure 12:
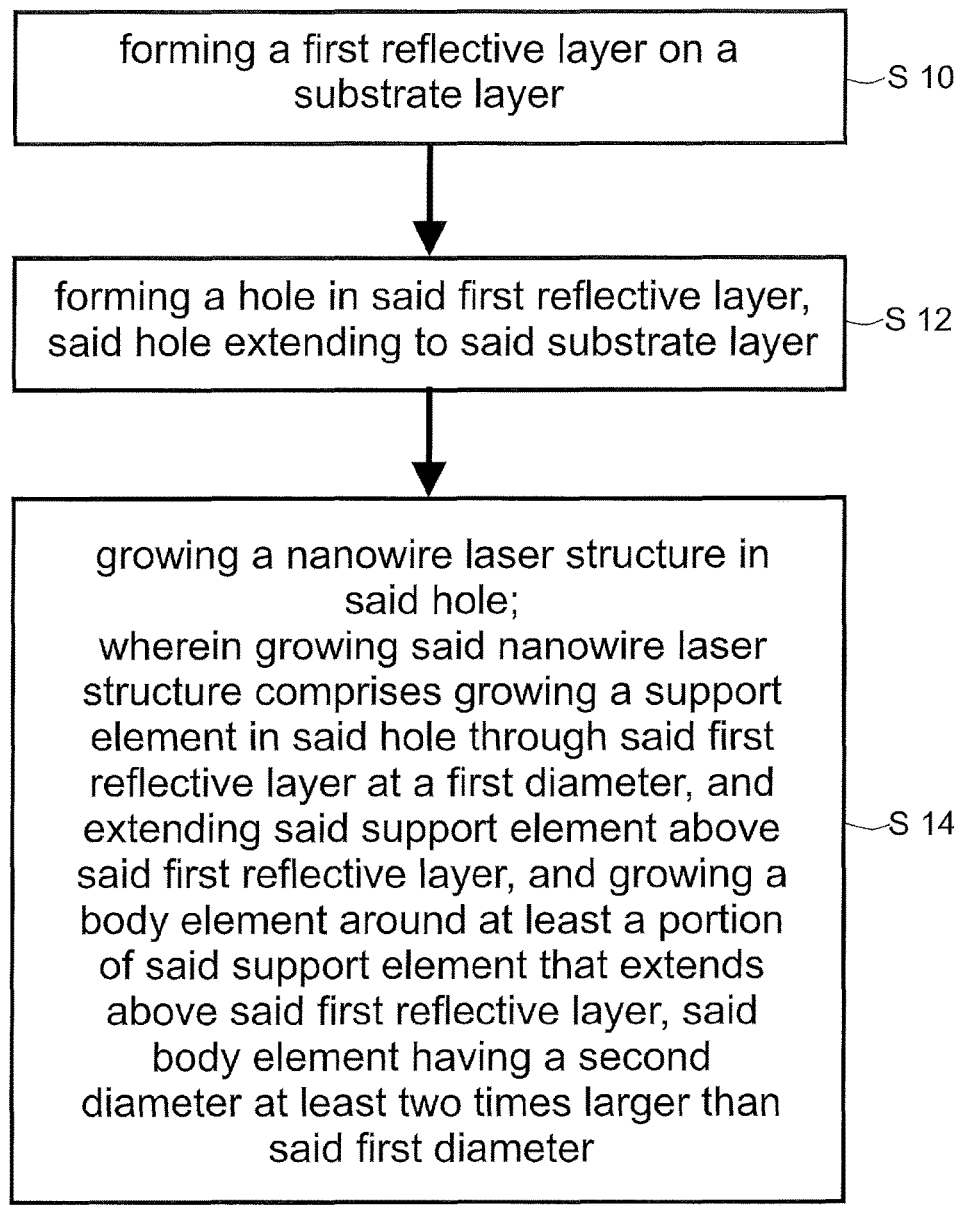
FIG. 12 is a flow diagram illustrating a fabrication method for forming a nanowire laser structure according to an example.
Figure 13:
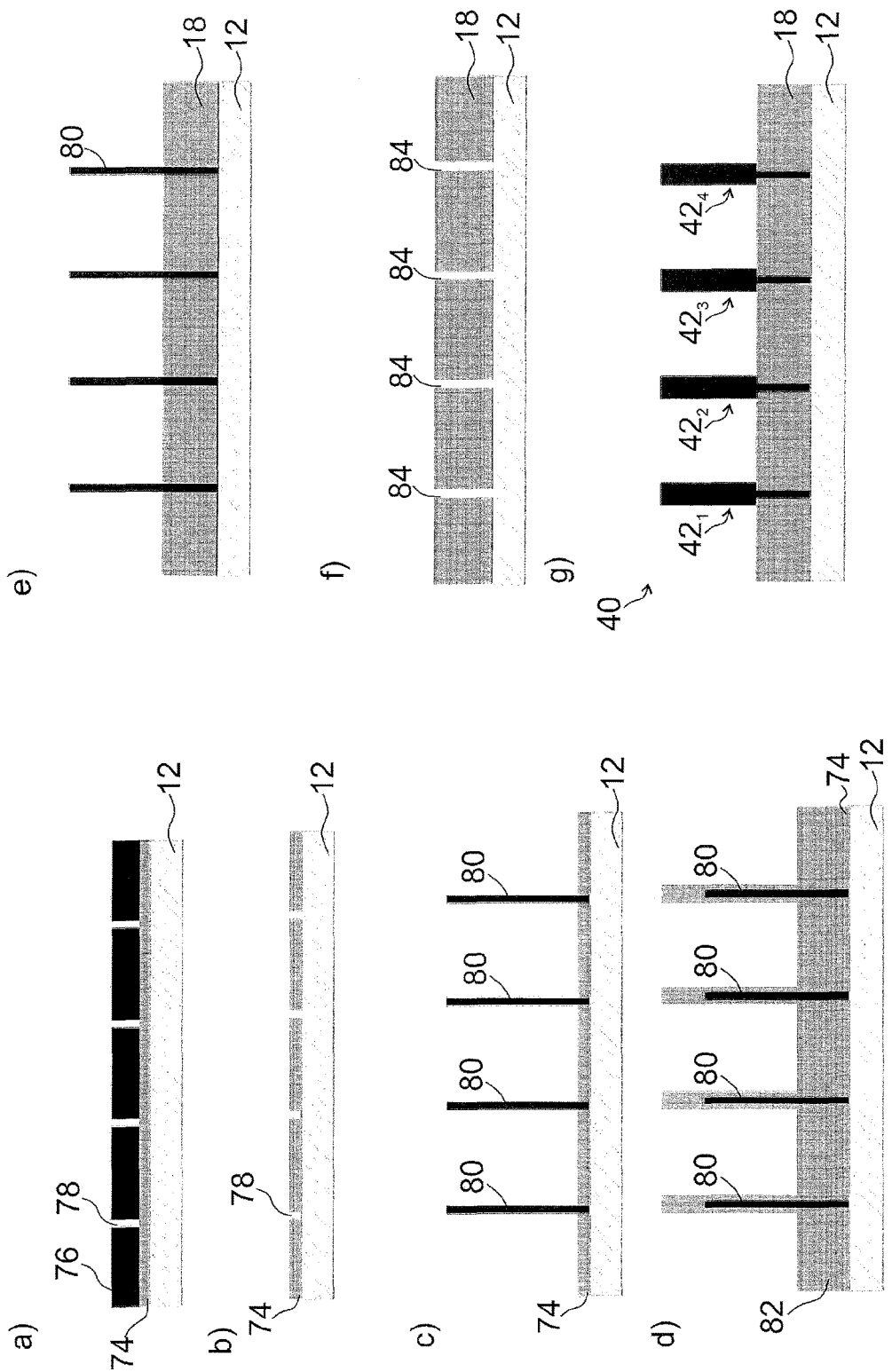
FIGS. 13a to 13g illustrate a method for forming a nanowire laser structure according to another example, using a sacrificial wire technique.

With reference to FIG. 11 and FIG. 12, a fabrication process will now be described that can achieve viable ultrathin (sub-100 nanometer) openings in exemplary $SiO_2$ layers with approximately 200 nm thickness or even thicker, in order to monolithically integrate nanowires on silicon in such a way that lasing from a vertical-cavity nanowire laser is possible.

FIG. 11a shows a 200 nm-thick $SiO_2$ reflective layer 18 formed on a silicon (111) substrate 12. The reflective layer 18 may be spin-coated with a positive electro-beam resist ZEP 520A using high rotational speed in the range of 1000 to 4000 rpm and a spinning duration of 2 to 4 minutes. Afterwards, the sample may be placed on a hotplate at a temperature of approximately 150° C. for another three minutes to bake the resist layer. The ZEP resist layer on top of the $SiO_2$ reflective layer 18 may be formed at a thickness of approximately 300 to 400 nm. Due to its high etching resistance and good resolution, this type of resist is highly suitable for the intense etching process required for deep hole etching in $SiO_2$, and has been found to perform better than conventional PMMA typically used in e-beam lithography.

After spin coating and baking, sub-100 nanometer wide holes 70 are exposed in the ZEP resist layer 72 using standard electron beam lithography with a dose calibrated for good lithographic quality. The corresponding configuration is shown in FIG. 11b.

For ease of presentation, the technique is described for holes with circular openings. However, holes with a rectangular or hexagonal cross-section may likewise be formed.

If an array of nanowire lasers shall be formed on the same substrate 12, such as a nanowire laser array 40 described above with reference to FIG. 8, multiple holes 70 can be fabricated in the same e-beam lithography step next to each other. The minimum hole separation shall in this case be chosen greater than the diameter of the body element 16 of the nanowire laser structure that shall be fabricated, so to prevent an undesirable merging or coalescing of adjacent nanowire laser structures that could result in a detuning and deterioration of the mode confinement. Good results can be achieved with a minimum distance in the range of 350 nm or more. Larger distances in the range of 1 μm or more could be employed in case electric contacts shall be provided to individual nanowire laser structures. For applications that require a coupling between the nanowire lasers, spacings no larger than 100 nm can be employed. In such a configuration, nanowire lasers can couple by virtue of their optical near field and, thus, exchange their optical phases. A phase information transfer could either be used to establish a common phase between all nanowire lasers for fully coherent devices, or achieve very complex emission dynamics leading to chaotic light emission for cryptography applications.

The structure can be developed in a ZED-N50 solution to remove the resist at the e-beam exposed positions only and thereby introduce a hole-profile into the ZEP layer. By using an anisotropic reactive ion etching (RIE) process with fluoric gas $C_4F_8$, this profile can then be transferred to the $SiO_2$ reflective layer 18 underneath. The inventors found it advantageous not to complete the RIE etching process all the way down to the surface of the substrate 12, since this might cause damage and might hinder the nucleation and growth of nanowire structures in the desired quality. The RIB etching process may be completed in such a way that the bottom of the holes 70 terminate approximately 5 to 10 nm above the upper surface of the substrate 12, as schematically illustrated in FIG. 11c.

The process parameters for the RIE etching process can be optimized based on the respective RIE process chamber design. For instance, good results could be obtained with a temperature of 15° C., a pressure of approximately $2\times10^{-5}$ mbar, an inductive coupled plasma (ICP) forward power of approximately 400 W, a RF generator forward power of approximately 100 W, a helium backing of approximately 10 sccm and a DC bias voltage of approximately 344 V.

The inventors found that the resistivity of the ZEP resist layer 72 has a remarkable dependence on the duration of the etching step, and generally increases with decreasing etching time per etching step. Good results could be obtained by dividing the total hole etching into six subsequent steps with the following sequence: 4×15 seconds, 1×10 seconds, and 1×7 seconds.

The resist may then be removed by a lift-off process in a ZDMAC solution for approximately five minutes during a supersonic treatment.

The remaining 5 to 10 nm of $SiO_2$ at the bottom of the holes 70 may subsequently be removed by means of a hydrofluoric acid (HF) etching process with an etching rate that can be carefully adjusted based on calibration runs. Good results could be obtained with very low etching rates in the range of 0.5 to 3.5 nm/s so as to be able to terminate the wet chemical etching step right at the interface of the silicon substrate 12, as illustrated in FIG. 11d. Uncontrolled etching or too high etching rates could lead to strong underetching due to the isotropic nature of the HF chemical etchant. Moreover, terminating the HF etching step right at the substrate interface leads to a smooth crystalline surface on the silicon substrate 12 that assists in the subsequent nanowire growth process.

In a short oxygen plasma etching step and subsequent solving cleaning that may involve acetone and/or isopropanol, all residual organic substances are removed, and the sample is ready for growth of bottom-up nanowire laser structures from the holes 70. A plurality of epitaxial techniques can be employed in the growth of the nanowire laser structure 10, comprising molecular beam epitaxy (MBE) or metal-organic chemical vapor deposition (MOCVD).

The inventors found that good results can be achieved by refraining from using a gold metal catalyst, contrary to many conventional nanowire growth techniques. The reason is threefold: (i) Gold is not readily CMOS compatible if integration on existing CMOS platforms is desired; (ii) gold is reactive and may etch the underlying Si substrate 12, causing undesired defects; and (iii) the presence of a gold catalyst may inhibit the formation of radial growth of the nanowire laser cavity. The inventors obtained better results with a self-catalyzed growth process or a completely catalyst-free growth mode.

In the sequel, a growth process for a nanowire laser structure 10 made from group III/group V semiconductors is described, but one skilled in the art will understand that similar techniques may be employed to fabricate nanowire laser structures from other semiconductor materials. In the self-catalyzed growth process, the group-III element may form a metallic droplet seed inside the hole 70 during the nucleation step. This seed droplet can comprise Ga or In, depending on whether GaAs or InGaAs-based nanowire lasers are desired. The growth temperature can be chosen so as to promote formation of the metal droplet only inside the hole 70, and not on the dielectric $SiO_2$ layer 18. Good growth selectivity can be achieved by using high substrate temperatures in the range of 500° C. and beyond. Once a droplet has formed inside the hole 70, the nanowire growth will then be promoted in the vertical direction due to the preferential nanowire growth orientation along the (111) crystallographic plane on (111) silicon. The nanowire may first be grown to a length of 1 μm or larger, such as 5 to 20 μm, to define the length of the nanowire laser cavity. In this case, a typical diameter of the support element 14 may be in the range of approximately 20 to 150 nm, depending on the growth conditions, such as III-V flux/pressure and temperature. This diameter range is typically insufficient to allow for an effective mode confinement. However, after growth of the inner nanowire support element 14, the growth process may be changed from axial to lateral growth, so as to widen the nanowire structure and thereby form the body element 16. This may be achieved by lowering the growth temperature to exploit the facet-dependent growth rate differences and induce radial growth along the {110} or {112} stable planes of III-V compound semiconductor nanowires. Even in the phase with preferred lateral growth, some limited axial growth on the upper end of the nanowire structure may still take place, which can be helpful to ensure that the body element 16 surrounds and covers the support element 14 also at the upper end. Depending on the desired optical confinement of the fundamental optical modes, the radial growth may result in a diameter of the body element 16 in the range of 200 nm or larger, for instance 300 to 600 nm for GaAs and InGaAs-based nanowires. During this radial growth step, the group-V pressure/flux may be increased so that growth takes place under group-V rich conditions. This has the additional benefit that the V-rich growth environment consumes the self-catalyzed metal droplet at the nanowire growth front, and therefore leads to a specular mirror-like end facet.

The result is a nanowire laser array 40 with a plurality of nanowire laser structures $42_1$ to $42_4$ in which the respective body elements 16 extend laterally only above the $SiO_2$ reflective layer 18, with a funnel-like support element 14 at the base that connects the respective body element 16 to the underlying substrate 12. As explained above, the nanowire laser structures $42_1$ to $42_4$ are anchored to the silicon substrate 12 while simultaneously maintaining their excellent waveguide properties with confinement factors larger than 90% above the dielectric reflective layer 18.

In a variant, the growth may proceed also without the use of self-catalyzed droplets. In this case, the nanowire laser cavity dimension may be given by the competition between the facet-dependent differences in growth rates. Under good conditions, growth of the nanowire may take place simultaneously in the vertical and radial direction. This holds the benefit that the cavity can be grown in a single growth step, as opposed to the self-catalyzed growth procedure described above with reference to FIG. 11e. The catalyst-free growth mode can be realized by selecting growth conditions that induce a ratio r between an axial and a radial growth rate in the range of r=10 to 150. In this case, the nanowire growth front will naturally form a mirror-smooth end facet. After the growth is completed, a wider band gap material may be employed to passivate the nanowire surface, so as to increase the quantum efficiency of the laser device.

The basic steps of a method for forming a nanowire laser structure are summarized schematically in the flow diagram of FIG. 12.

In a first step S10, the first reflective layer 18 is formed on the substrate layer 12. In a second step S12, a hole 70 is formed in the first reflective layer 18, wherein the hole 70 extends to the substrate layer 12. In a third step S14, a nanowire laser structure 10/42 is grown in the hole 70, wherein growing the nanowire laser structure 10/42 comprises growing a support element 14/44 in the hole 70 through the first reflective layer 18 at a first diameter $d_1$, and extending the support element 14/44 above the first reflective layer 18, and growing a body element 16/46 around at least a portion of the support element 14/44 that extends above the first reflective layer 18, wherein the body element 16/44 has a second diameter $d_2$ at least twice the first diameter $d_1$.

In case the substrate 12 comprises a waveguide layer 34, such as described above with reference to FIGS. 6a to 7c, the manufacturing may proceed in the same way as described above with reference to FIGS. 11 and 12, wherein the reflective layer 18 is formed on the waveguide layer 34, and the holes 70 extend to the waveguide layer 34.

Another example technique for realizing deep nano-apertures in a dielectric layer such as $SiO_2$ is a sacrificial nanowire growth technique that will now be described schematically with reference to FIG. 13a-13g. This method may be particularly useful when the operator has no access to advanced nanometric lithography techniques, or cannot achieve the desired deep holes by conventional e-beam or nano imprint lithography.

As illustrated in FIG. 13a, a thin dielectric mask layer 74 may be formed on the substrate layer, such as a silicon substrate 12, by means of e-beam lithography or nano imprint lithography. For instance, the dielectric mask layer 74 may comprise $SiO_2$ at a thickness in the range of 5 to 30 nm. As further illustrated in FIG. 13a, a patterned resist layer 76 with holes 78 may be formed on the dielectric mask layer 74. For instance, the resist layer 76 may comprise PMMA.

Subsequent reactive ion etching (RIE) and/or hydrofluoric acid (HF) etching may then be employed to extend the holes 78 down through the dielectric mask layer 74 and to the upper surface of the silicon substrate 12. The resulting structure (after removal of the resist layer 76) is shown in FIG. 13b.

As illustrated in FIG. 13c, sacrificial nanowire structures 80 are then grown in the holes 78 in the vertical direction. These sacrificial nanowire structures 80 only need to be as high as a few hundred nanometers, and in particular just as high as the desired thickness of the first reflective layer 18. The sacrificial nanowire structures 80 may be grown to a maximum diameter of approximately 200 nm, and are preferably composed of a material that can be easily etched by wet chemistry or decomposed thermally at temperatures below the respective decomposition/dissolution temperature of the desired first reflective layer 18. For instance, the sacrificial nanowire structures 80 may be formed of a combination of group III/group V semiconductor material, such as InAs, InGaAs, or GaAs. These nanowires can be thermally evaporated under both ambient and vacuum conditions at temperatures of 400 to 800° C., and hence well below the onset for subliming $SiO_2$ at 1000° C. The resulting structure comprising the sacrificial nanowires 80 is show in FIG. 13c.

Once the sacrificial nanowire structures 80 have been grown, in a subsequent step a thick dielectric layer 82 may be grown on the dielectric mask layer 74 and the sacrificial nanowire structures 80, as schematically illustrated in FIG. 13d. Growth of the dielectric layer 82 may involve techniques such as sputtering, plasma-enhanced chemical vapor deposition (PECVD), atomic layer deposition (ALD) or epitaxial techniques such as molecular beam epitaxy (MBE) or metal-organic chemical vapor deposition (MOCVD). For instance, the dielectric layer 82 may comprise $SiO_2$ or SiN at a thickness of 200 nm or higher. The use of epitaxial techniques such as MBE and/or MOCVD also allows to form a dielectric layer 82 comprising a distributed Bragg reflector and/or a high contrast grating.

As schematically shown in FIG. 13d, the sacrificial nanowire structures 80 may be parasitically covered by the dielectric layer deposit 82 on all their facets. In order to minimize the parasitic deposits on the side walls of the sacrificial nanowire structure 80 that protrude above the desired dielectric mirror layer 18, the inventors found it advantageous to employ highly directional sputtering techniques for forming the dielectric layer 82, rather than more homogeneous techniques such as atomic layer deposition. This is because sputtering from a target under near normal incidence will usually result in a more anisotropic growth of the parasitic dielectric, with substantial dielectric layer material 82 on the top facet of the sacrificial nanowire structures 80, but only relatively thin layers of dielectric material on the side facets, as schematically shown in FIG. 13d. In contrast, atomic layer deposition usually results in a more isotropic growth with parasitic dielectric layers 82 uniformly distributed all around the sacrificial nanowire structures 80.

In a subsequent step, the parasitic deposits of the dielectric layer 82 on the sacrificial nanowire structures 80 may be etched, such as by employing buffered hydrofluoric acid (HF). The inventors found that dipping the sample very shortly into the buffered HF solution is sufficient to remove the thin parasitic layer of the dielectric 82 from the sacrificial nanowire structures 80. The resulting sample is shown in FIG. 13e. The dielectric layer that remains on the substrate 12 corresponds to the first reflective layer 18 at the desired thickness.

The sample may now be transferred to an annealing device capable of providing temperatures in the range of approximately 800° C. At these temperatures, the sacrificial nanowire structures 80 dissolve thermally. For instance, thermal decomposition of GaAs sacrificial nanowires 80 in high vacuum of $10^{-6}$ to $10^{-9}$ Torr requires annealing temperatures in the range of 650 to 750° C. The inventors found it helpful to monitor the evaporating species during the annealing procedure, such as by mass spectrometry in situ. The annealing process can be considered completed once no more measurable traces of the evaporating species are detected in the mass spectrometer. This allows the determination of the time duration of the annealing procedure.

The annealing step leaves behind the configuration shown in FIG. 13f, with thin nano-holes 84 whose shapes and diameters corresponds to the diameters of the (removed) sacrificial nanowire structures 80 and that extend through the entire reflective layer 18 down to the substrate 12.

By means of the technique described above with reference to FIGS. 13a to 13f, thin nano-holes 84 with diameters in the range of 100 nm or less may be forming in a dielectric reflective layer 18 at a thickness of 200 nm or even more.

The growth of a plurality of nanowire laser structures $42_1$ to $42_4$ in the nano-holes 84 may then proceed as described above with reference to FIG. 11e, resulting in the nanowire laser array 40 schematically illustrated in FIG. 13g.

With reference to FIGS. 13a to 13g, a sacrificial nanowire growth technique has been described that involves the formation of a very thin initial dielectric mask layer 74. The mask layer 74 is helpful to support a site-selective growth.

However, alternatively a sacrificial nanowire growth technique may also proceed without the initial dielectric mask layer 74. In this case, the sacrificial nanowire structures 80 are grown directly bottom-up on the substrate, such as the silicon substrate 12, for instance by means of a self-catalyzed growth process that involves the formation of metal seed droplets directly on the silicon substrate 12.

The vertical nanowire growth described above with reference to FIGS. 11 to 13 can best be achieved by starting from a silicon (111) substrate. Another example fabrication technique is particularly suitable for the fabrication of nanowire laser structures or a nanowire laser array on a fully CMOS-compatible platform, which usually demand fabrication on a silicon (100) surface. III-V nanowires have an intrinsic thermodynamically favorable tendency to grow along the (111) crystal orientation, independently of the crystallographic orientation of the underlying substrate. Hence, while they grow vertically on Si (111), they usually grow in an inclined direction 79° away from the surface normal when grown on Si (100).

In order to still realize a vertically well-oriented nanowire laser structure on Si (100), one needs to force the nanowire growth into a (100) crystallographic orientation. This can be achieved by using sacrificial hollow microtube pillars made from dielectrics such as $SiO_2$ or SiN directly on a Si (100) substrate. For instance, an array of well-defined micropillars with sizes of approximately the size of the final nanowire laser cavity may be formed by standard deep-reactive ion etching (RIB) or inductive coupled plasma (ICP) etching of a Si (100) substrate with lengths of 10 μm or beyond and diameters of several hundred nanometers. This has already been demonstrated for third-generation Si-based nanostructured photovoltaic applications. One may then use either anionic oxidation or plasma-enhanced chemical vapor deposition (PECVD) growth to coat the Si micropillars with an $SiO_2$ layer. In a subsequent step, the core of the $SiO_2$/Si (100) micropillars may be selectively etched by selective wet chemical etchant, thereby leaving behind a hollow cylindrical $SiO_2$ microtube. Employing this microtube on the Si (100) platform, the growth of the III-V compound semiconductor nanowire laser can then be promoted inside the hollow openings. The entire surface area around the hollow tube may consist of a dielectric mask layer, such as $SiO_2$. This may guarantee that the growth species cannot adhere to the mask layer and only grow in areas where the naked Si (100) surface is exposed, i.e. inside the tube openings, resulting in a selective area growth. Once the nanowire laser structure is grown into these microtube openings to a length determined by the tube length, the sample is subsequently coated with a thick dielectric mirror, similarly to the technique described above with reference to FIG. 13d. The dielectric mirror layer may be formed at a thickness of 200 nm or more. As long as the thickness of the $SiO_2$ shell on the microtube is not too thick, preferably smaller than 50 nm, it may be removed together with the $SiO_2$ microtube walls in a subsequent hydrofluoric acid (HF) etching, resulting in a nanowire laser structure on top of the dielectric mirror/Si (100) template.

As described above with reference to FIG. 7c, non-vertical nanowire laser structures 10 may be beneficial to promote the coupling of higher-order modes to an underlying waveguide layer 34. The intrinsic inclined growth of III-V nanowires on Si (100) can be exploited as a simple and very effective means to achieve tilted nanowire laser structures 10. For instance, one may grow III-V nanowire laser structures 10 directly on a Si (100) substrate, similarly to the self-catalyzed direct bottom-up process described above, resulting in nanowire laser structures tilted at 79° with respect to the surface normal. In a subsequent step, a thick dielectric reflective layer 18 may then be formed around the nanowire laser, as described before.

The description of the preferred embodiments and the Figures merely serve to illustrate the invention and the beneficial effects associated therewith, but it should not be understood to imply any limitation. The scope of the invention is to be determined from the appended claims.

REFERENCE SIGNS 10, 10', 10" nanowire laser structure
12 substrate
14 support element, core
16 body element, shell
18 first reflective layer
20 contact layer
22 second reflective layer
24 radial pn junction
26 lateral pn junction
28 intrinsic layer of the body element 16
30 barrier layer of the body element 16
32 outer layer of the body element 16
34 waveguide layer
36 scattering object
38 grating
40 nanowire laser array
$42_1$-$42_4$ nanowire laser structures of nanowire laser array 40
$44_1$-$44_4$ support elements of nanowire laser structures $42_1$-$42_4$
$46_1$-$46_4$ body elements of nanowire laser structures $42_1$-$42_4$
48 common contact layer
$50_1$-$50_4$ top reflection layers of nanowire laser structures $42_1$-$42_4$
52 lens
54 cooling channels
56, 56' interferometer element
$58_1$, $58_2$ branches of interferometer element 56, 56'
60 output path of interferometer element 56, 56'
62 reflective element
64 optical gate
66 feedback path
68 non-linear element
70 holes
72 resist layer
74 dielectric mask layer
76 resist layer
78 holes
80 sacrificial nanowire structures
82 dielectric layer
84 nano-holes

What is claimed is:

1. A nanowire laser structure, comprising:
   a substrate;
   an elongated support element extending from said substrate, said support element having a first diameter; and
   an elongated body element extending on and/or around said support element, said body element having a second diameter at least two times larger than said first diameter;
   wherein said body element is spaced apart from said substrate;
   said nanowire laser structure further comprising a pn junction or a pin junction;
   wherein said nanowire laser structure is adapted to emit a laser signal at a wavelength λ, wherein said first diameter of said support element is smaller than $\lambda/(2n)$, wherein n denotes an index of refraction of said support element; and wherein said second diameter of said body element is no smaller than $\lambda/m$, wherein m denotes an index of refraction of said body element.

2. The nanowire laser structure according to claim 1, further comprising a first reflective layer between said body element and said substrate.

3. The nanowire laser structure according to claim 2, wherein said first reflective layer comprises a distributed Bragg reflector and/or a high contrast grating.

4. The nanowire laser structure according to claim 2, further comprising a second reflective layer formed above said body element on a side of said body element facing away from said substrate.

5. The nanowire laser structure according to claim 1, wherein said substrate comprises a waveguide.

6. The nanowire laser structure according to claim 5, wherein said support element extends from said waveguide.

7. The nanowire laser structure according to claim 1, further comprising:
   an interferometer element optically coupled to said body element, wherein said interferometer element comprises a first laser signal path and a second laser signal path that together form a closed loop;
   an output path coupled to said first laser signal path and said second laser signal path; and
   a gate element located in said second laser signal path, wherein said gate element is adapted to selectively change a refractive index of said second laser signal path.

8. The nanowire laser structure according to claim 7, further comprising a feedback path coupling said output path to said gate element.

9. A laser array comprising:
   a plurality of nanowire laser structures, each nanowire laser structure of said plurality of nanowire laser structures comprising:
      an elongated support element extending from a substrate, said support element having a first diameter; and
      an elongated body element extending on and/or around said support element, said body element having a second diameter at least two times larger than said first diameter;
   wherein said body element is spaced apart from said substrate;
   each said nanowire laser structure further comprising a pn junction or a pin junction;
   wherein said nanowire laser structure is adapted to emit a laser signal at a wavelength $\lambda$,
   wherein said first diameter of said support element is smaller than $\lambda/(2n)$, wherein n denotes an index of refraction of said support element;
   wherein said second diameter of said body element is no smaller than $\lambda/m$, wherein m denotes an index of refraction of said body element; and
   wherein said substrate of each nanowire laser structure is a common substrate of said plurality of nanowire laser structures.

10. The laser array according to claim 9, further comprising at least one cooling channel for a cooling medium, said cooling channel extending between adjacent nanowire laser structures of said plurality of nanowire laser structures.

11. A method for forming a nanowire laser structure, comprising:
   forming a first reflective layer on a substrate layer;
   forming a hole in said first reflective layer, said hole extending to said substrate layer; and
   growing a nanowire laser structure in said hole;
   wherein growing said nanowire laser structure comprises growing a support element in said hole through said first reflective layer at a first diameter, and extending said support element above said first reflective layer, and growing a body element around at least a portion of said support element that extends above said first reflective layer, said body element having a second diameter at least two times larger than said first diameter;
   doping said support element and/or said body element to form a pn junction or a pin junction;
   wherein said nanowire laser structure is adapted to emit a laser signal at a wavelength $\lambda$, wherein said first diameter of said support element is smaller than $\lambda/(2n)$, wherein n denotes an index of refraction of said support element; and
   wherein said second diameter of said body element is no smaller than $\lambda/m$, wherein m denotes an index of refraction of said body element.

12. The method according to claim 11, wherein said forming said hole comprises a step of forming a first hole in said first reflective layer by anisotropic reactive ion etching, wherein said first hole terminates within said first reflective layer, and afterwards extending said first hole to said substrate layer by chemical etching.

13. The method according to claim 12, wherein the chemical etching is hydrofluoric acid etching.

* * * * *